(12) United States Patent
Kawasaki et al.

(10) Patent No.: US 11,846,037 B2
(45) Date of Patent: Dec. 19, 2023

(54) CRYSTAL MANUFACTURING METHOD, CRYSTAL MANUFACTURING APPARATUS AND SINGLE CRYSTAL

(71) Applicant: TDK CORPORATION, Tokyo (JP)

(72) Inventors: Katsumi Kawasaki, Tokyo (JP); Jun Arima, Tokyo (JP); Minoru Fujita, Tokyo (JP); Jun Hirabayashi, Tokyo (JP)

(73) Assignee: TDK CORPORATION, Tokyo (JP)

( * ) Notice: Subject to any disclaimer, the term of this patent is extended or adjusted under 35 U.S.C. 154(b) by 0 days.

(21) Appl. No.: 17/702,158

(22) Filed: Mar. 23, 2022

(65) Prior Publication Data

US 2022/0307157 A1    Sep. 29, 2022

(30) Foreign Application Priority Data

Mar. 25, 2021    (JP) .................... 2021-051396

(51) Int. Cl.
    *C30B 13/18*    (2006.01)
    *C30B 15/16*    (2006.01)
    *C30B 15/30*    (2006.01)
    *C30B 15/20*    (2006.01)
    *C30B 29/16*    (2006.01)

(52) U.S. Cl.
    CPC ............. *C30B 15/16* (2013.01); *C30B 15/20* (2013.01); *C30B 15/30* (2013.01); *C30B 29/16* (2013.01)

(58) Field of Classification Search
    CPC ......... C30B 29/16; C30B 13/30; C30B 13/18; Y10T 117/1076; Y10T 117/1088
    See application file for complete search history.

(56) References Cited

U.S. PATENT DOCUMENTS

| 4,931,945 A * | 6/1990 | Taguchi ................. C30B 13/30 117/933 |
|---|---|---|
| 11,098,416 B2 * | 8/2021 | Xia .......................... H01B 1/08 |
| 2004/0007708 A1 | 1/2004 | Ichinose et al. |
| 2006/0001031 A1 | 1/2006 | Ichinose et al. |

(Continued)

FOREIGN PATENT DOCUMENTS

| JP | 100036190 | * 2/1998 |
|---|---|---|
| JP | 2833432 B2 | 12/1998 |

(Continued)

OTHER PUBLICATIONS

Lei et al., "Reduced radial resistivity variation of FZ Si wafers with Advanced NTD," Journal of Crystal Growth, 2019, vol. 512, pp. 65-68.

(Continued)

*Primary Examiner* — Robert M Kunemund
(74) *Attorney, Agent, or Firm* — Oliff PLC

(57) ABSTRACT

In a crystal manufacturing method, first, a feedstock including a tapered tip portion is disposed above a crystal growth region. Then, a side surface of the tip portion is selectively heated and melted by radiant heat traveling diagonally upward while a shape of the tip portion is maintained, and the side surface of the tip portion is physically connected to an upper surface of the crystal growth region by a material melted from the side surface. In a crystal manufacturing apparatus, the radiant heat for melting the feedstock is radiated from an electric resistance heater.

14 Claims, 12 Drawing Sheets

(56) References Cited

U.S. PATENT DOCUMENTS

| | | | |
|---|---|---|---|
| 2008/0070337 A1 | 3/2008 | Ichinose et al. | |
| 2008/0237607 A1 | 10/2008 | Ichinose et al. | |
| 2009/0072239 A1* | 3/2009 | Oohira | C30B 29/16 |
| | | | 257/E29.091 |
| 2010/0038652 A1 | 2/2010 | Ichinose et al. | |
| 2013/0160698 A1* | 6/2013 | Raming | C30B 13/20 |
| | | | 117/51 |
| 2013/0248902 A1 | 9/2013 | Ichinose et al. | |
| 2014/0306237 A1 | 10/2014 | Ichinose et al. | |
| 2017/0306521 A1 | 10/2017 | Hoshikawa et al. | |
| 2019/0352795 A1* | 11/2019 | Schroeck | C30B 13/32 |
| 2020/0149183 A1* | 5/2020 | Schroeck | C30B 13/20 |

FOREIGN PATENT DOCUMENTS

| | | | |
|---|---|---|---|
| JP | 3679097 B2 | 8/2005 | |
| JP | 2017-193466 A | 10/2017 | |
| WO | WO 2017070827 | * | 5/2017 |

OTHER PUBLICATIONS

Víllora et al., "β-Ga2O3 and single-crystal phosphors for high-brightness white LEDs & LDs, and β-Ga2O3 potential for next generation of power devices," Proc. of SPIE, Oxide-based Materials and Devices V, 2014, vol. 8987, pp. 89871U-1-89871U-12.

Víllora et al., "Large-size β-Ga2O3 single crystals and wafers," Journal of Crystal Growth, 2004, vol. 270, pp. 420-426.

Barter et al., "Thermal Expansion of Rhodium-Platinum Alloys," Platinum Metals Rev., 1960, vol. 4, No. 4, pp. 138-140.

* cited by examiner

CRYSTAL MANUFACTURING METHOD, CRYSTAL MANUFACTURING APPARATUS AND SINGLE CRYSTAL

TECHNICAL FIELD

The present disclosure relates to a crystal manufacturing method, a crystal manufacturing apparatus, and a single crystal.

BACKGROUND

Patent Document 1 discloses a floating zone (FZ) method for manufacturing semiconductor silicon (Si). In the FZ method, an electric current flows on a surface of a feedstock to melt the feedstock due to a magnetic field formed by a radio frequency (RF) heater. Since the molten Si has conductivity, it can be held by a binding force of an electromagnetic field in addition to a surface tension. Therefore, when a radio frequency heating type FZ method is used, a Si single crystal having a size of φ6 inches (200 mm) can be manufactured (refer to Non-Patent Document 1). The single crystal Si formed by the FZ method can be used for high withstand voltage devices that require high purity and high quality.

Patent Document 2 discloses an FZ method for manufacturing a single crystal of gallium oxide ($Ga_2O_3$). Gallium oxide ($Ga_2O_3$, or the like) is attracting attention as a new semiconductor material. An energy band gap of $Ga_2O_3$ is larger than that of Si, larger than that of silicon carbide (SiC), and larger than that of gallium nitride (GaN). Therefore, an electronic device using $Ga_2O_3$ is expected to have characteristics of a high withstand voltage, a high output, low loss, and high temperature resistance. $Ga_2O_3$ has a crystal structure such as α, β, γ, δ, ε, κ, and the like. In the crystal structures, $\beta$-$Ga_2O_3$ has a crystal structure having a monoclinic β-phase and has an energy band gap of about 4.8 eV. A melting point of $\beta$-$Ga_2O_3$ is about 1800° C. Non-Patent Document 2 and Non-Patent Document 3 disclose a method for manufacturing a $\beta$-$Ga_2O_3$ single crystal using the FZ method, but a diameter φ of the crystal is about 1 inch (about 2.5 cm).

Patent Document 3 discloses a vertical Bridgman (VB) method. The VB method uses a crucible. As a crystal manufacturing method using a crucible, an edge-defined film-fed growth (EFG) method, a Czochralski (Cz) method and the like are known. The crucible can be formed, for example, from platinum (Pt) to which rhodium (Rh) is added. A constituent material (for example, Rh) of the crucible may affect semiconductor properties as a dopant. Non-Patent Document 4 discloses characteristics of platinum to which Rh has been added.

(Patent Document 1) Japanese Patent No. 2833432
(Patent Document 2) Japanese Patent No. 3679097
(Patent Document 3) Japanese Unexamined Patent Publication No. 2017-193466
(Non-Patent Document 1) "Reduced radial resistivity variation of FZ Si wafers with Advanced NTD", Journal of Crystal Growth, 2019, Vol. 512, p. 65-p. 68
(Non-Patent Document 2) "$\beta$-$Ga_2O_3$ and single-crystal phosphors for high-brightness white LEDs & LDs, and $\beta$-$Ga_2O_3$ potential for next generation of power devices", Proc. of SPIE Vol. 8987, Oxide-based Materials and Devices V, 2014, Vol. 89871, p. 89871U1-89871U12
(Non-Patent Document 3) "Large-size $\beta$-$Ga_2O_3$ single crystals and wafers", Journal of Crystal Growth, 2004, Vol. 270, Issues 3-4, p. 420-p. 426
(Non-Patent Document 4) "Thermal Expansion of Rhodium-Platinum Alloys", Platinum Metals Rev., 1960, Vol. 4, (4), p. 138-p. 140

SUMMARY

However, according to the conventional method for manufacturing gallium oxide or the like using an RF heater or the like, a size of a single crystal that can be manufacturing is small. There is a demand for a single crystal having a large size, a crystal manufacturing method capable of manufacturing such a single crystal, and a crystal manufacturing apparatus therefor.

A crystal manufacturing method of the present disclosure includes disposing a feedstock including a tapered tip portion above a crystal growth region, and selectively heating and melting a side surface of the tip portion by radiant heat traveling diagonally upward while a shape of the tip portion is maintained, and physically connecting the side surface of the tip portion to an upper surface of the crystal growth region by a material melted from the side surface. An RF heater not only generates heat in the material, but also provides a binding force to a molten material due to an electromagnetic field. Meanwhile, when the material is melted by selectively irradiating the side surface of the tip portion with the radiant heat, such a binding force can be suppressed, and a size of the manufactured single crystal can be increased.

A crystal manufacturing apparatus of the present disclosure includes a means for performing such a process. The crystal manufacturing apparatus of the present disclosure includes a means for disposing a feedstock including a tapered tip portion above a crystal growth region, and a means for selectively heating and melting a side surface of the tip portion by radiant heat traveling diagonally upward while a shape of the tip portion is maintained, and physically connecting the side surface of the tip portion and an upper surface of the crystal growth region by a material melted from the side surface. The crystal manufacturing apparatus of the present disclosure includes a support configured to support a feedstock with a tapered tip portion, an electric resistance heater configured to generate radiant heat for melting a feedstock that travels diagonally upward, and a heat shield disposed below the electric resistance heater.

A single crystal of the present disclosure is a single crystal manufactured by such a means. The single crystal of the present disclosure is a single crystal formed on a crystal growth region by disposing a feedstock including a tapered tip portion above the crystal growth region, and selectively heating and melting a side surface of the tip portion by radiant heat traveling diagonally upward while a shape of the tip portion is maintained, and physically connecting the side surface of the tip portion to an upper surface of the crystal growth region by a material melted from the side surface. According to the crystal manufacturing apparatus, a size of the manufactured single crystal can be increased.

According to the crystal manufacturing method and the crystal manufacturing apparatus of the present disclosure, a single crystal having a large size can be manufactured.

DETAILED DESCRIPTION

Figure 1:
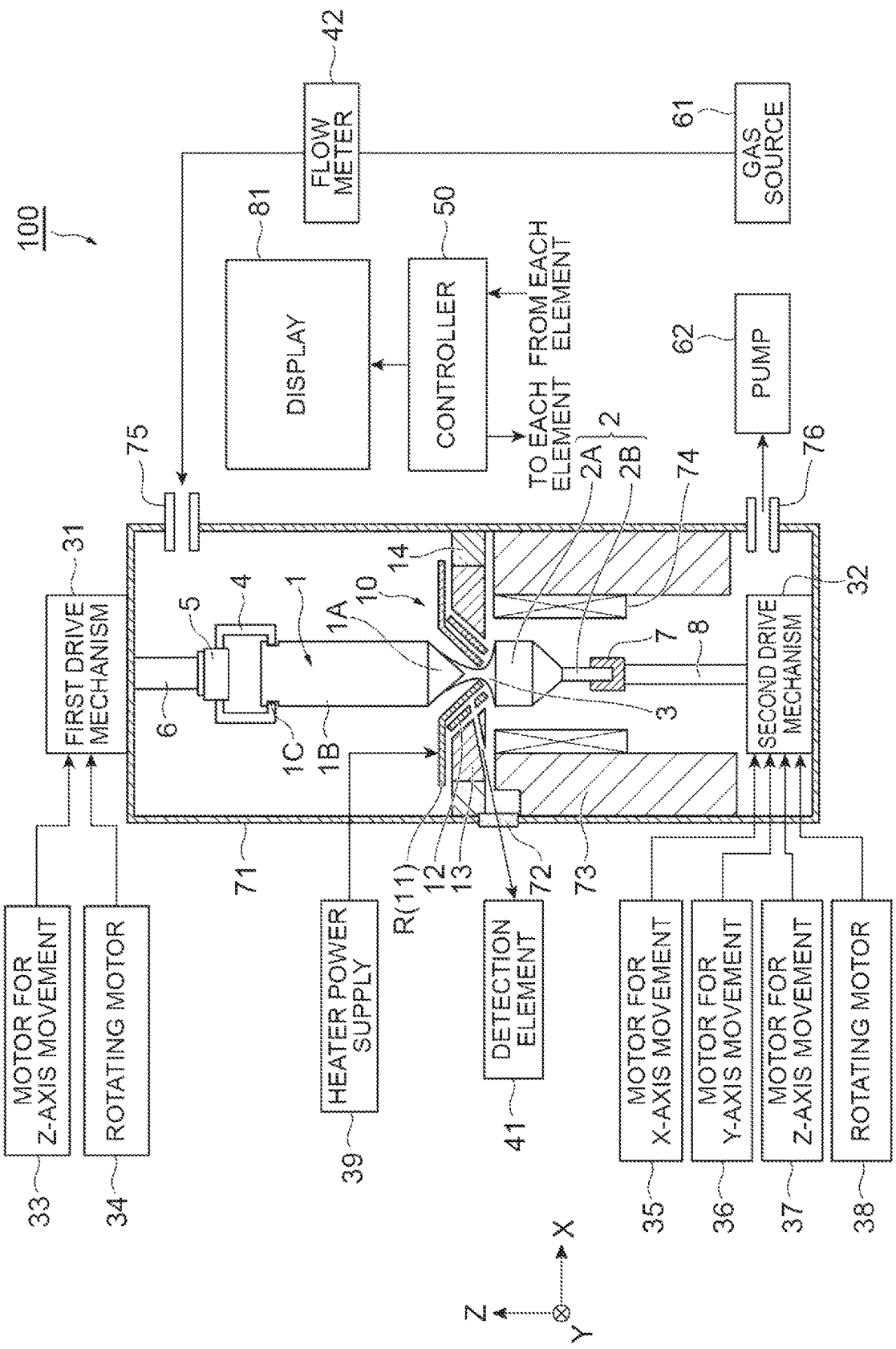
FIG. 1 is a diagram showing a longitudinal cross-sectional configuration and a system of a crystal manufacturing apparatus according to an embodiment.

Hereinafter, various exemplary embodiments will be described in detail with reference to the drawings. In addition, the same or corresponding parts in each of the drawings are designated by the same reference numerals, and duplicate description will be omitted.

FIG. 1 is a diagram showing a longitudinal cross-sectional configuration and a system of the crystal manufacturing apparatus 100 according to an embodiment. For the sake of explanation, an XYZ three-dimensional Cartesian coordinate system is set. An upward direction in a vertical direction is a positive direction of a Z axis. A horizontal plane is perpendicular to the Z axis and includes an X axis and a Y axis. The X axis and the Y axis are orthogonal to each other.

The crystal manufacturing apparatus 100 accommodates a feedstock 1 therein. The feedstock 1 has a tip portion 1A, a feedstock main body portion 1B, and a first engaging portion 1C. In a state during a crystal growth period, a crystal 2 is located below the tip portion 1A. The crystal 2 has a crystal main body portion 2A and a seed crystal 2B that is a source of growth of the crystal main body portion 2A. An upper surface of the solid crystal main body portion 2A constitutes a crystal growth region 2U (refer to FIG. 2). A molten material 3 is located between the feedstock 1 and the crystal 2. The molten material 3 is a material in which a side surface of the tip portion 1A of the feedstock 1 is melted during the crystal growth period.

The first engaging portion 1C located at an upper end portion of the feedstock 1 is held by a feed holder 4. The first engaging portion 1C of this example is a recess provided in the feedstock 1, and the feed holder 4 is engaged in the recess. The feed holder 4 is connected to an upper shaft 6 via a connection block 5. The upper shaft 6 is supported by a first drive mechanism 31 fixed to an upper portion of a processing container 71. Therefore, the feedstock 1 is supported by a support including the feed holder 4, the connection block 5, the upper shaft 6, and the first drive mechanism 31. A basic function of the support is to suspend and support the solid feedstock 1, and many structures having such a function can be conceived, and the present invention is not limited by the structure.

In the first drive mechanism 31, an elevating movement (a Z-axis movement) of the upper shaft 6 and a rotating movement of the upper shaft 6 around a central axis thereof can be performed. As a structure of the first drive mechanism 31, a plurality of structures can be considered. For example, an elevating gear having a rotating shaft in a horizontal direction and a rotating gear having a rotating shaft in a direction of a vertical axis may be provided. The elevating gear and the rotating gear are fixed to the upper shaft 6. The first drive mechanism 31 includes drive gears that engage with the gears. When the drive gears are driven, the upper shaft 6 can perform the elevating movement and the rotating movement.

An upper motor 33 for the Z-axis movement is mechanically connected to the elevating drive gear of the first drive mechanism 31, and a driving force is transmitted from the upper motor 33 for the Z-axis movement. An upper rotating motor 34 is mechanically connected to the rotating drive gear of the first drive mechanism 31, and a driving force is transmitted from the upper rotating motor 34.

The seed crystal 2B located at a lower portion of the crystal 2 is held by a seed crystal holder 7. The seed crystal holder 7 is fixed to and supported by an upper end of a lower shaft 8. The lower shaft 8 is supported by a second drive mechanism 32 fixed to a lower portion of the processing container 71. Therefore, the crystal 2 is supported by a support including the seed crystal holder 7, the lower shaft 8, and the second drive mechanism 32. A basic function of the support is to support the solid crystal 2 from below, and many structures having such a function can be considered, and the present invention is not limited to the structures.

In the second drive mechanism 32, a horizontal movement (an X-axis movement and a Y-axis movement) of the lower shaft 8, an elevating movement (a Z-axis movement), and a rotating movement of the lower shaft 8 around a central axis thereof can be performed. As the structure of the second drive mechanism 32, a plurality of structures can be considered. Regarding the elevating movement and the rotating movement, for example, the elevating gear and the rotating gear are fixed to the lower shaft 8 as in the case of the first drive mechanism 31. The second drive mechanism 32 includes drive gears that engage with the gears. When the drive gears are rotated, the lower shaft 8 can perform the elevating movement and the rotating movement. For the horizontal movement, an appropriate movement mechanism such as an XY stage may be used. For example, a rack and pinion type gear mechanism can move a rack linearly by rotating a pinion (a drive gear). The gear mechanism can be applied to a mechanism for the X-axis movement and a mechanism for the Y-axis movement.

A lower motor 35 for the X-axis movement is mechanically connected to an X-axis movement drive gear of the second drive mechanism 32, and a driving force is transmitted from the lower motor 35 for the X-axis movement. A lower motor 36 for the Y-axis movement is mechanically connected to a Y-axis movement drive gear of the second drive mechanism 32, and a driving force is transmitted from the lower motor 36 for the Y-axis movement. A lower motor 37 for the Z-axis movement is mechanically connected to the elevating drive gear of the second drive mechanism 32, and a driving force is transmitted from the lower motor 37 for the Z-axis movement. A lower rotating motor 38 is mechanically connected to a rotating drive gear of the second drive mechanism 32, and a driving force is transmitted from the lower rotating motor 38. The elevating mechanism of the second drive mechanism 32 may be a pantograph type jack.

A heating device 10 is disposed around the tip portion 1A of the feedstock 1. The heating device 10 includes an electric resistance heater group 11, a (heat) reflector 12, and a heat shield 13. The electric resistance heater group 11 includes a plurality of electric resistance heaters R. The heating device 10 is supported by a heating device support 14 that fixes the heat shield 13 to the processing container 71. The heating device 10 heats a side surface of the tip portion 1A of the feedstock 1 by radiant heat radiated from the electric resistance heaters R. A material on the side surface of the heated tip portion 1A melts, moves downward along the side surface due to gravity, reaches an upper surface of the crystal 2 and is then crystallized. The radiant heat is infrared electromagnetic waves generated by a heating element.

A heater power supply 39 is electrically connected to the electric resistance heater group 11. When electric power is supplied from the heater power supply 39 to the electric resistance heater group 11, each of the electric resistance heaters R generates heat and radiates radiant heat. A lower end or the whole of the tip portion 1A of the feedstock 1 is observed by a detection element 41. The detection element 41 is a camera and/or a radiation thermometer. An observation window 72 is disposed between the lower end of the tip portion 1A of the feedstock 1 and the detection element 41. The observation window 72 is made of a transparent material such as quartz glass and is fixed to a side wall of the processing container 71.

A gas introduction port 75 is provided in a side wall of the processing container 71. The processing container 71 is a container for blocking an internal space from outside air to create an atmosphere and environment different from the atmosphere. A gas is supplied from a gas source 61 into the processing container 71 via a flow meter 42 and the gas introduction port 75. This gas is, for example, a mixed gas of oxygen ($O_2$) and argon (Ar). As a suitable example, it is assumed that the feedstock 1 is made of $Ga_2O_3$. When an element (oxygen) contained in the feedstock 1 is supplied from the gas source 61 into the processing container 71, it is possible to prevent a component of the contained element (oxygen) from coining out of the crystal. A partial pressure of the contained element (oxygen) in the processing container 71 can be set to 10% or more. Although the flow meter 42 is a sensor that detects a gas flow rate, it may have a function of controlling the gas flow rate, such as a mass flow controller (MFC). Although FIG. 1 shows one gas source 61, the crystal manufacturing apparatus 100 may include gas sources supplying a plurality of gas types.

A gas discharge port 76 is provided in the side wall of the processing container 71. The gas in the processing container 71 is exhausted by a pump 62 through the gas discharge port 76. A gas pressure in the processing container 71 is preferably, for example, 1 atm. The gas pressure in the processing container 71 can be controlled by controlling a supply amount and a discharge amount of the gas.

A heat insulating material 73 is provided on an inner wall of the processing container 71. The heat insulating material 73 surrounds the crystal 2 and the lower shaft 8. A heating element 74 different from the electric resistance heater R can be provided around the crystal 2. The heating element 74 can heat the crystal 2 independently of the electric resistance heater R and can provide a temperature distribution suitable for crystal growth and cooling to the crystal 2. The heating element 74 is provided inside the heat insulating material 73. The heating element 74 surrounds the crystal 2 and heats the crystal 2. The type of the heating element 74 is not particularly limited as long as it can heat the crystal 2. The heating element 74 may also be configured of an electric furnace constituted of an electric resistance heater. Not much of the heat from the upper heating device 10 is transferred to the lower crystal 2. Therefore, the heating element 74 independently controls a temperature of the crystal 2. For example, when the heating of the crystal 2 due to the heating element 74 is weakened, the molten material 3 that has reached the crystal 2 is cooled and easily crystallized.

A controller 50 acquires a signal from the above-described element and outputs a control signal to the element of the target group to be controlled. When the controller 50 acquires a detected value such as a temperature from a sensor group (for example, temperature sensors), the controller 50 can control an element to be controlled (for example, the heater power supply 39) so that the detected value becomes a target value, and can perform feedback control. Of course, the controller 50 also controls each of the above-described motors. A rotation sensor is provided in each of the motors, and a Z-direction movement speed of the feedstock, a rotation speed of the feedstock, an X-direction movement speed of the crystal, a Y-direction movement speed of the crystal, a Z-direction movement speed of the crystal, and a rotation speed of the crystal can be indirectly obtained from an output signal of the rotation sensor. A sensor that detects the gas pressure in the processing container 71 may be provided. The controller 50 displays detected values from various sensors, an image of the tip portion of the feedstock, and the like on a display 81.

Figure 2:
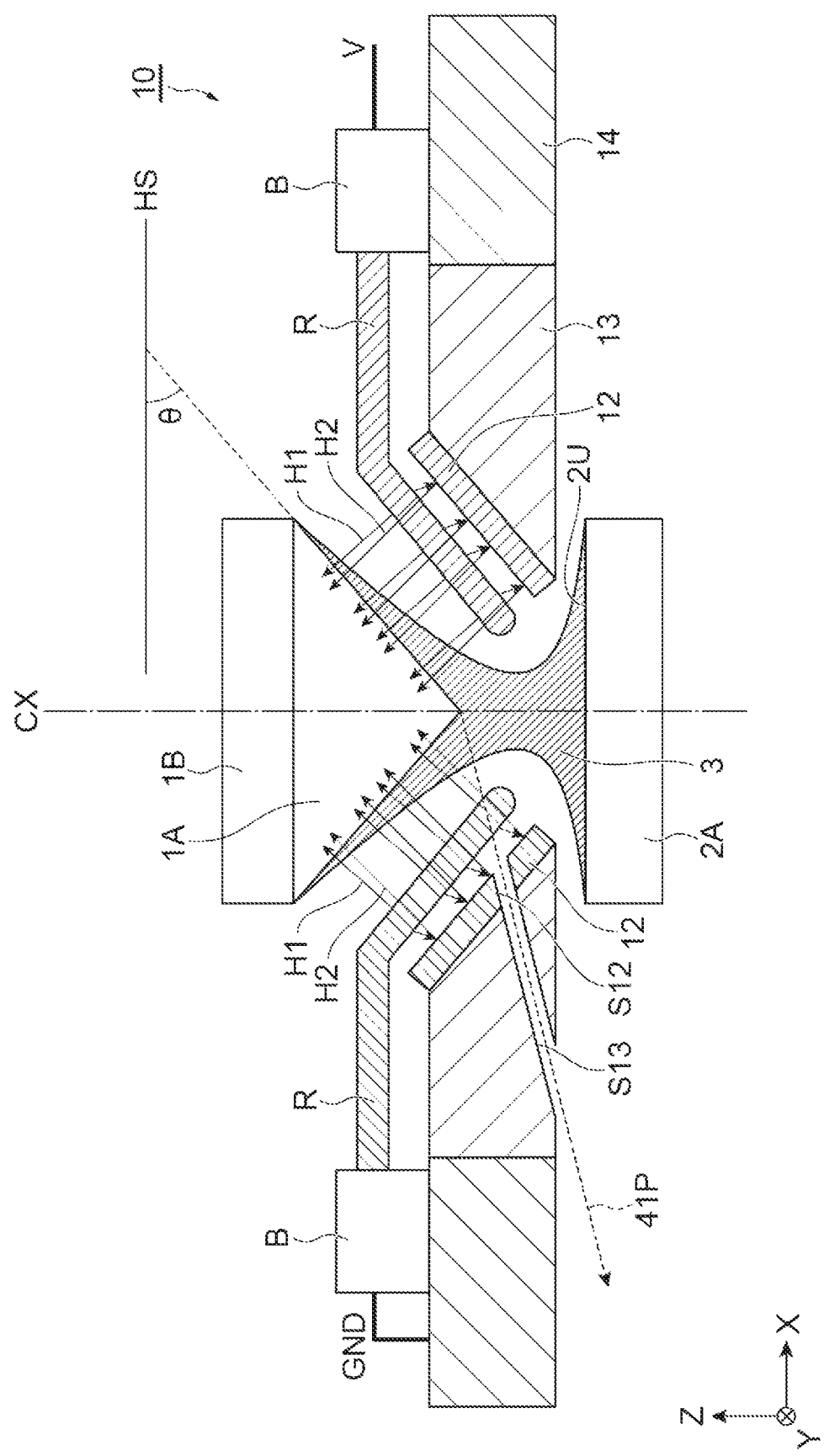
FIG. 2 is a diagram showing a longitudinal cross-sectional configuration around a tip portion of a feedstock.

FIG. 2 is a diagram showing a longitudinal cross-sectional configuration around the tip portion of the feedstock. The feedstock and the crystal main body portion show not the cross-sectional configuration but show a side surface configuration seen in the Y-axis direction.

The tip portion 1A of the feedstock has a tapered shape. That is, a diameter of the tip portion 1A decreases in a negative direction of the Z axis. The crystal main body portion 2A is disposed below the tip portion 1A. An upper surface of the crystal main body portion 2A constitutes the crystal growth region 2U. The tip portion 1A faces the crystal growth region 2U. The molten material 3 is interposed between the side surface of the tip portion 1A and the crystal growth region 2U of the crystal main body portion 2A. The molten material 3 physically connects the side surface of the tip portion 1A to an upper surface of the crystal growth region 2U.

The material on the side surface of the tip portion 1A is melted by the radiant heat radiated from the plurality of electric resistance heaters R.

One electric resistance heater R will be described. First radiant heat radiated from the electric resistance heater R travels diagonally upward along a first radiant heat traveling path H1 and reaches the side surface of the tip portion 1A. The electric resistance heater R has a resistance portion that extends in an inclined manner with respect to a horizontal plane HS. This resistance portion has a smaller diameter than that of a horizontally extending portion. In an XZ cross section passing through a central axis CX of the feedstock 1, in this example, the first radiant heat traveling path H1 extends in a direction perpendicular to the resistance portion of the electric resistance heater R that extends in an inclined manner.

Second radiant heat radiated from the electric resistance heater R first travels diagonally downward along a second radiant heat traveling path H2, is reflected by the reflector 12, and then travels diagonally upward to reach the side surface of the tip portion 1A. The side surface of the tip portion 1A is heated by the first radiant heat directly reaching the side surface and the second radiant heat reaching the side surface after being reflected.

A shape of the tip portion 1A is an inverted cone in which top and bottom of a general cone are inverted. The shape of the tip portion 1A may be an inverted truncated cone, and a line of intersection between the XZ surface and the side surface may not be a straight line. The shape of the tip portion 1A is such that the material melted on the side surface of the tip portion 1A moves downward along the side surface without dripping directly downward in the vertical direction. From this point of view, in a vertical cross section (an XZ cross section) including the central axis CX of the feedstock 1, an acute angle θ formed by the side surface of the tip portion 1A and the horizontal plane HS located above the side surface is in a range of 30 to 60 degrees. The acute angle θ may be in a range of 40 to 50 degrees. An example of a preferable acute angle θ is θ=45 degrees. In the vertical cross section (the XZ cross section) including the central axis CX of the feedstock, an acute angle formed by an exposed surface of the reflector 12 and the horizontal plane may be set to the acute angle θ described above.

The gravity acting on the molten material that is present on the side surface (an inclined surface of a conical portion) of the tip portion 1A can be divided into a force acting in a direction perpendicular to the inclined surface and a force acting in a direction parallel to the inclined surface. Due to the force acting in the direction parallel to the inclined surface, the molten material 3 gathers at an apex of the lower end portion and moves from this position to the lower crystal growth region 2U. An amount of molten material generated on the inclined surface (the side surface) of the tip portion 1A, an amount of molten material moving on the inclined surface, a force acting in a direction perpendicular to the inclined surface, a surface tension of the molten material, and a binding force due to a slight electromagnetic field determine the amount of molten material 3 that can be held on the inclined surface. The molten material 3 can be stably supplied onto the crystal growth region 2U by setting the acute angle θ as described above.

It is preferable to rotate the feedstock 1 so that the side surface of the tip portion 1A melts evenly, but crystal growth can be performed even when the feedstock 1 is not rotated. An approximate shape of the feedstock 1 is a shape having high rotational symmetry with respect to the central axis CX, and is preferably a cylindrical shape, but other shapes are also possible.

The electric resistance heater R is disposed between the tip portion 1A and the crystal growth region 2U and radiates radiant heat traveling at least diagonally upward. The radiant heat traveling diagonally upward includes the first radiant heat radiated directly diagonally upward from the electric resistance heater R and the second radiant heat radiated downward from the electric resistance heater R and reflected by the reflector 12.

The reflector 12 has a reflector opening S12. The heat shield 13 has a ring shape with an open central region. The reflector 12 is fixed to an inner inclined surface of an opening of the heat shield 13. The heat shield 13 has a heat shield opening S13. The reflector opening S12 and the heat shield opening S13 communicate with each other to form an information traveling path 41P. The detection element 41 shown in FIG. 1 detects information (temperature and video) of the feedstock 1 transmitted along the information traveling path 41P via the reflector opening S12 and the heat shield opening S13.

An outer peripheral surface of the heat shield 13 is mounted in an inner surface of the ring-shaped heating device support 14. There are various aspects of a mounting means. In addition to a mounting method using bolts and nuts, a plurality of aspects can be considered, such as a mounting method in which the inner surface of the heating device support 14 has a stepped shape and the outer peripheral surface of the heat shield 13 has a stepped shape that engages with the stepped shape. The radiant heat radiated downward from the electric resistance heater R is blocked by the reflector 12 and the heat shield 13 disposed between the electric resistance heater R and the crystal growth region 2U. An inner portion of the heat shield 13 is located directly above a peripheral region on the crystal growth region 2U. An outer portion of the heat shield 13 is not located on the crystal growth region 2U.

The molten material 3 has an exposed surface having a first outer diameter in a horizontal plane including a lower end of the tip portion 1A of the solid. The molten material 3 has an exposed surface having an outer diameter smaller than the first outer diameter in the horizontal plane including the lower end of the electric resistance heater R. In other words, a central portion of the molten material 3 is constricted. The lower end of the molten material 3 is in contact with the upper surface of the crystal growth region 2U, and an outer diameter of this contact region is larger than the first outer diameter in the horizontal plane.

A plurality of electric resistance heater holders B is fixed to the upper surface of the heating device support 14. Each of the electric resistance heater holders B has a through hole that extends in a radial direction of the heating device support 14. Since the electric resistance heater R has an electrode at an outer end portion thereof, this electrode is inserted into the through hole. An inner surface of the through hole of the electric resistance heater holder B is a conductor, and this conductor is connected to the heater power supply 39. One end of the electric resistance heater R is electrically connected to a ground potential GND, and the other end is electrically connected to a power supply potential V.

Figure 3:
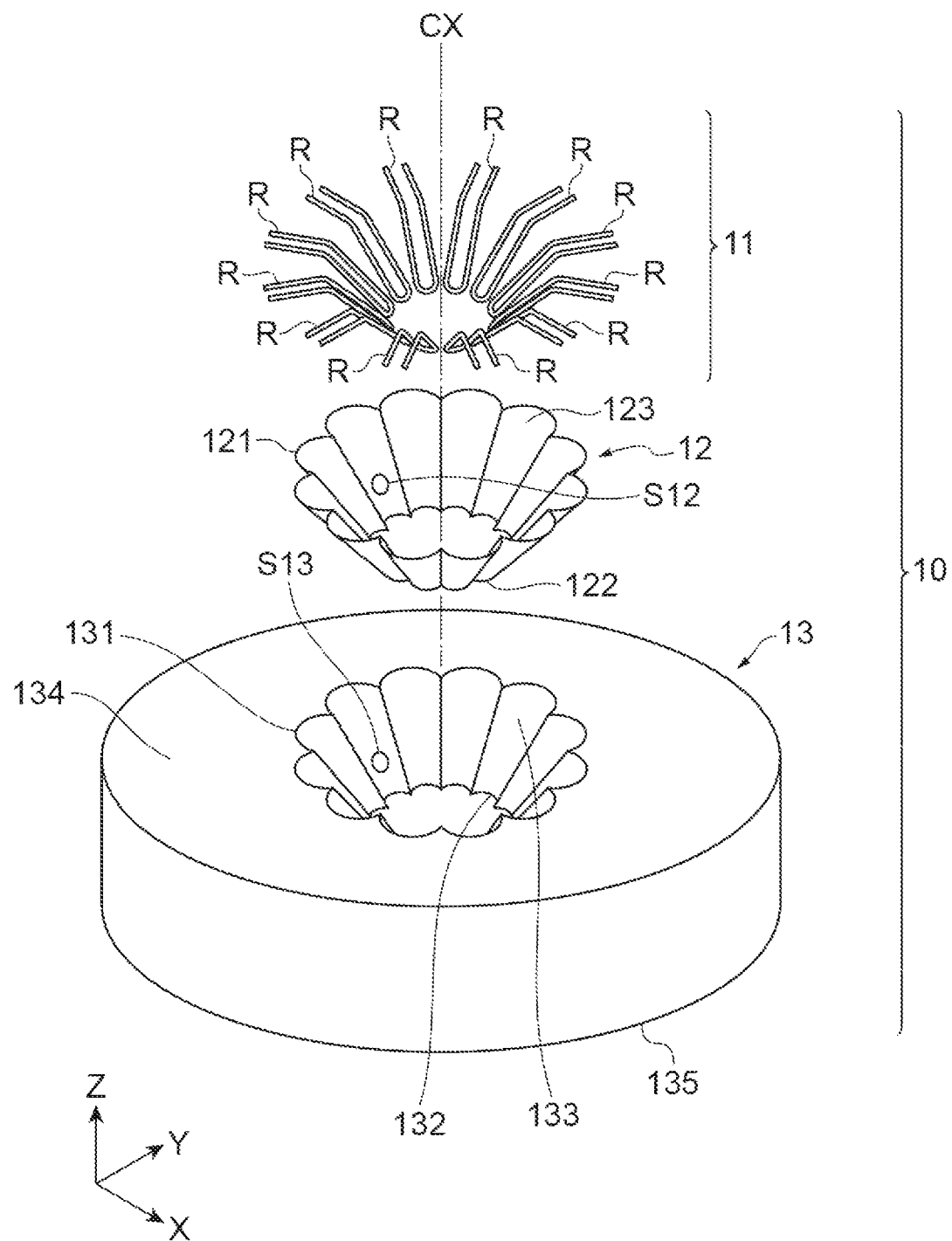
FIG. 3 is an exploded perspective view of a heating device including an electric resistance heater group, a reflector, and a heat shield.

FIG. 3 is an exploded perspective view of the heating device 10 including the electric resistance heater group 11, the reflector 12, and the heat shield 13.

The heat shield 13 has an opening in a central region thereof, and a diameter of an inner surface of the opening becomes smaller toward the bottom. A heat shield opening inner surface 133 is inclined with respect to the Z-axis direction in a vertical cross section (an XZ cross section) including the central axis CX of the feedstock. The opening in the central region of the heat shield 13 extends from a heat shield opening upper edge 131 of a heat shield upper surface 134 to a heat shield opening lower edge 132 of a heat shield lower surface 135, and a through hole is formed.

A shape of the heat shield opening inner surface 133 in a horizontal plane (an XY plane) is a ring shape including a plurality of continuous concave surfaces. A shape of each of the concave surfaces in the horizontal plane is an elliptical arc or an arc other than the elliptical arc. The reflector 12 is supported by the heat shield opening inner surface 133. A horizontal cross-sectional shape of a reflector inner surface 123 includes a ring shape including a plurality of continuous concave surfaces, similar to the opening shape of the heat shield 13. The reflector inner surface 123 extends from a reflector upper end surface 121 to a reflector lower end surface 122, and a through hole is formed.

The electric resistance heater group 11 is configured of a plurality of electric resistance heaters R. In this example, twelve electric resistance heaters R are shown, and the electric resistance heaters R are disposed at equal intervals in a circumferential direction surrounding the central axis CX of the feedstock.

The reflector inner surface 123 includes concave surfaces (concave curves) having a shape such as an elliptical arc in a horizontal plane in the circumferential direction. The reflector 12 has a concave surface that extends radially from the central axis CX, and the plurality of concave surfaces are also grooves that extend radially. A cross-sectional shape of the groove is substantially elliptical, and a resistor (a heating element) of the electric resistance heater R can be disposed at a focal point on one side, and a focal point on the other side can be disposed to be located on the side surface of the tip portion 1A. The heating elements located at the focal point of an ellipse are preferably disposed at individual focal points, but a heating element having a U-shape includes two parallel resistors, and a center position of the resistors may be disposed at the focal point.

When the radiant heat from the resistor of the electric resistance heater R is focused on the side surface of the tip portion of the feedstock, local heating becomes possible. Production points of the molten material can be dispersed by dispersing positions of the local heating at a plurality of positions on the side surface of the tip portion of the feedstock. Further, production positions of the molten material on the side surface of the tip portion of the feedstock can be averaged by rotating the feedstock, and the cone shape can be easily maintained at the time of melting.

The number of concave surfaces of the reflector 12 disposed below the electric resistance heater group 11 is the same as the number of electric resistance heaters R and is twelve. The number of electric resistance heaters R does not have to be twelve. The shapes of the plurality of electric resistance heaters R are all the same.

Since each of the electric resistance heaters R is, for example, a U-shaped heating element bent at an angle of 45 degrees and is disposed so as to extend radially from the central axis CX in a plan view, it is possible to radiate a group of radiant heat from the outer circumference to the center and from the bottom to the top.

Figure 4:
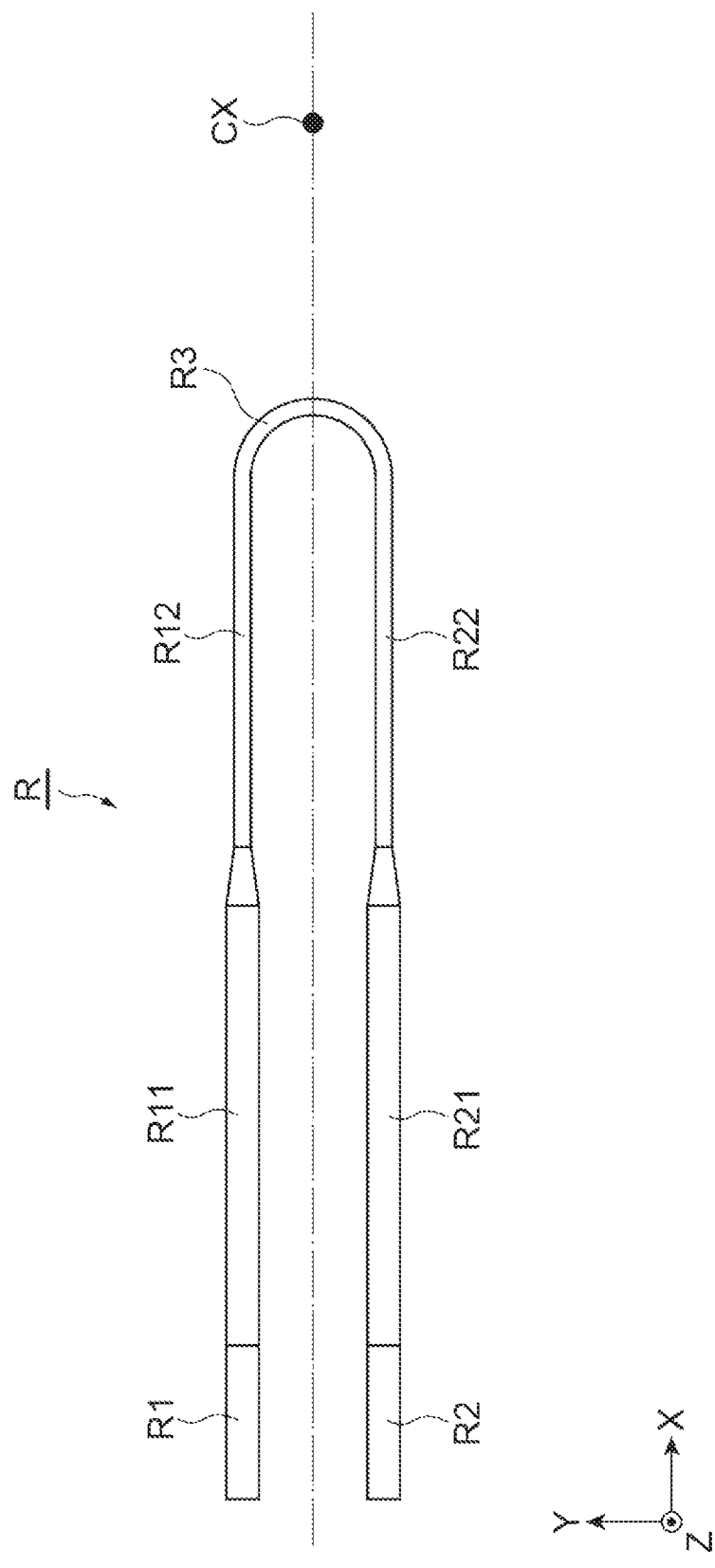
FIG. 4 is a plan view of an electric resistance heater.

FIG. 4 is a plan view of the electric resistance heater R.

A planar shape of the electric resistance heater R when seen from above is U-shaped and has a structure that is easily handled. When seen from above, the electric resistance heater R extends toward the central axis CX of the feedstock. The electric resistance heater R includes a first electrode R1, a first conductor R11, a first resistor R12, a connection resistor R3, a second resistor R22, a second conductor R21, and a second electrode R2, and each of the elements has a rod shape and is physically continuous.

A material of each part constituting the electric resistance heater R is basically the same resistance material, but the parts of the first electrode R1 and the second electrode R2 are coated with a metal material covering the resistance material. An example of the resistance material is a ceramic material, and an example of the metal material for electrodes is aluminum. As a high temperature resistant ceramic material, lanthanum chromite ($LaCrO_3$) or molybdenum disilicide ($MoSi_2$) can be used, but resistors using zirconia or carbon are also known.

As an example, the first electrode R1 and the second electrode R2 have a structure in which an aluminum film is provided on a surface of a conductor of $MoSi_2$. The first conductor R11, the first resistor R12, the connection resistor R3, the second resistor R22, and the second conductor R21 have a structure in which a $SiO_2$ (quartz glass) film is provided on a surface of the conductor of $MoSi_2$. Since the first resistor R12, the connection resistor R3, and the second resistor R22 have a small diameter, they mainly function as heat-generating resistors. Since the first conductor R11 and the second conductor R21 have a larger diameter than that of the resistors thereof, they function as conductors that supply a current to the resistors. When a voltage is applied between the first electrode R1 and the second electrode R2 located at both ends, a current flows through a portion that connects them, and heat is generated. The electric resistance heater R can be used up to about 1800° C.

$β-Ga_2O_3$ has a melting point of about 1800° C., and a decomposition reaction that loses oxygen occurs under an oxygen partial pressure smaller than 10%. Therefore, when $β-Ga_2O_3$ is manufactured, the electric resistance heater R is preferably a heating element that can perform the heating of 1800° C. or higher and can be used with an oxygen partial pressure of 10% or higher. Lanthanum chromite and molybdenum disilicide can meet these conditions.

Figure 5:
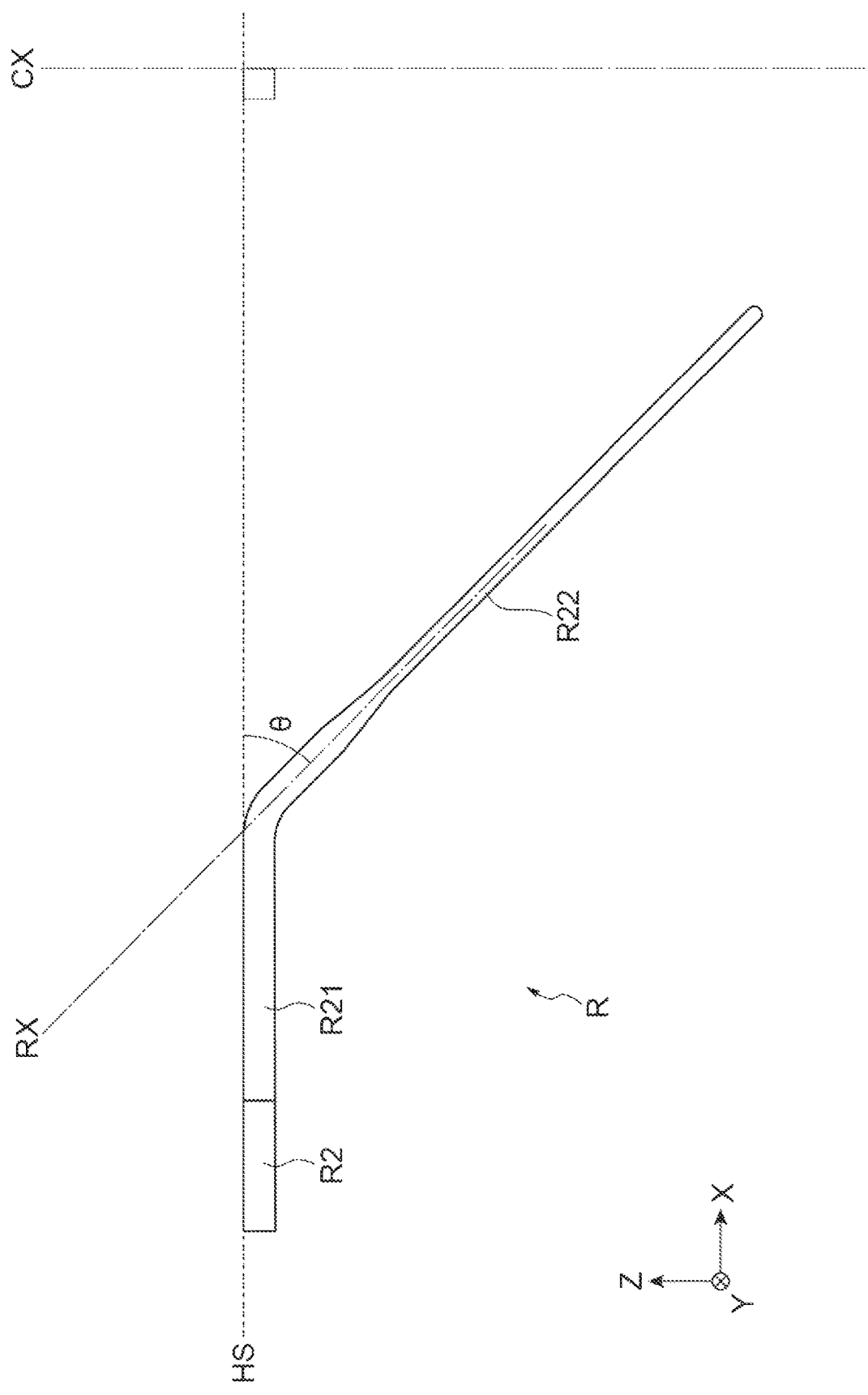
FIG. 5 is a side view of the electric resistance heater.

FIG. 5 is a side view of the electric resistance heater.

An acute angle α formed by a resistor central axis RX of the second resistor R22 (or the first resistor R12) and the horizontal plane HS is in a range of 30 to 60 degrees. The acute angle α may be in a range of 40 to 50 degrees. An example of a preferable acute angle α is α=45 degrees. An angle (an acute angle θ) of the side surface of the tip portion of the feedstock and an inclination angle (an acute angle α) of the resistor are set to an angle at which the shape of the side surface is kept constant when the feedstock is slowly moved downward while the side surface of the tip portion of the feedstock is heated.

Figure 6:
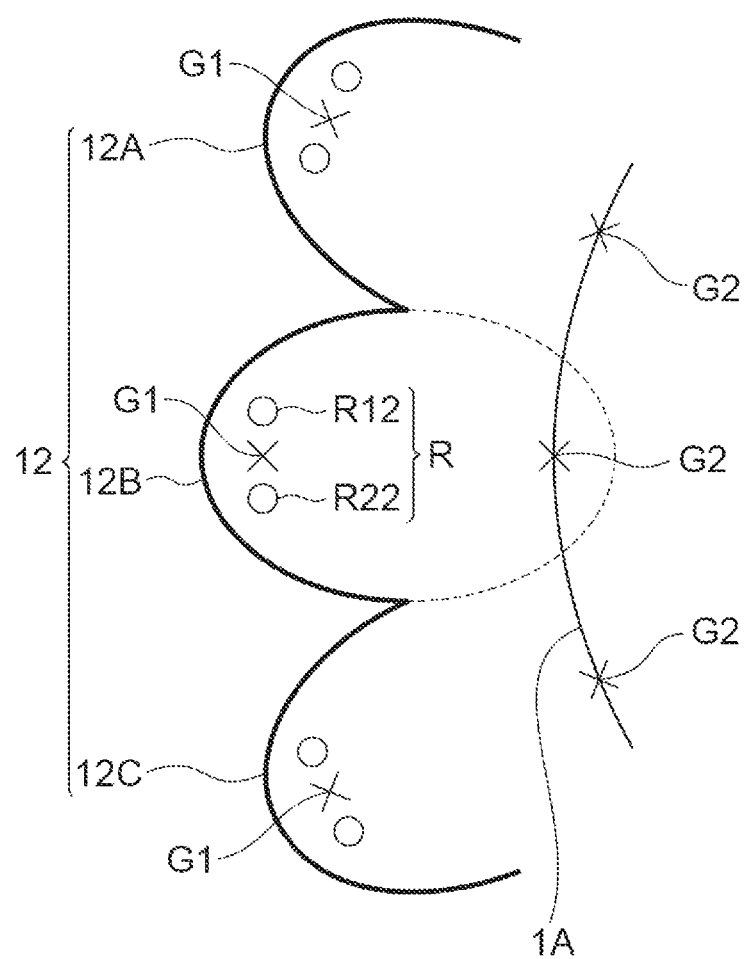
FIG. 6 is a diagram for describing a positional relationship between the electric resistance heater and the reflector.

FIG. 6 is a diagram for describing a positional relationship between the electric resistance heater R and the reflector 12.

An inner surface of the reflector 12 has a shape in which concave surfaces are continuous in the circumferential direction of the reflector 12. When a horizontal cross section of the reflector 12 is observed from above, a shape corresponding to each of the concave surfaces on the inner surface of the reflector 12 is exemplified by an elliptical arc. In FIG. 6, a first concave surface 12A, a second concave surface 12B, and a third concave surface 12C of the reflector 12 are shown. The electric resistance heater R is disposed inside the second concave surface 12B. The second concave surface 12B shown is not a horizontal cross-sectional shape, but a cross-sectional shape perpendicular to a longitudinal direction of the first resistor R12 (the resistor central axis RX (refer to FIG. 5)). A shape of the second concave surface 12B in the drawing is an elliptical arc. FIG. 6 also shows the positional relationship of the electric resistance heater R disposed in each of the concave surfaces in a plane perpendicular to the resistor central axis with respect to the first concave surface 12A and the third concave surface 12C, and a shape of the first concave surface 12A and a shape of the third concave surface 12C in FIG. 6 are both elliptical arcs.

The first resistor R12 and the second resistor R22 of one electric resistance heater R are both disposed inside the second concave surface 12B. An intermediate position (a position of a center of gravity on the drawing) between the first resistor R12 and the second resistor R22 is located on a first focal point G1 of an ellipse forming the elliptical arc including the second concave surface 12B. A second focal point G2 of the ellipse is located on the side surface of the tip portion 1A. Therefore, the radiant heat virtually radiated from the first focal point G1 is reflected by the second concave surface 12B and reaches the second focal point G2. Since the position of the first focal point G1 is the position of the center of gravity of the resistor, as a whole, the radiant heat radiated from the first and second resistors tends to collect near the position of the second focal point G2 on the side surface of the tip portion 1A. Similarly, with respect to the other first concave surface 12A and the third concave surface 12C, the radiant heat is focused and reaches the vicinity of the position of the second focal point G2 corresponding to each of the first concave surface 12A and the third concave surface 12C. Therefore, the side surface of the tip portion 1A can be melted at a higher temperature by the focused radiant heat.

Figure 7:
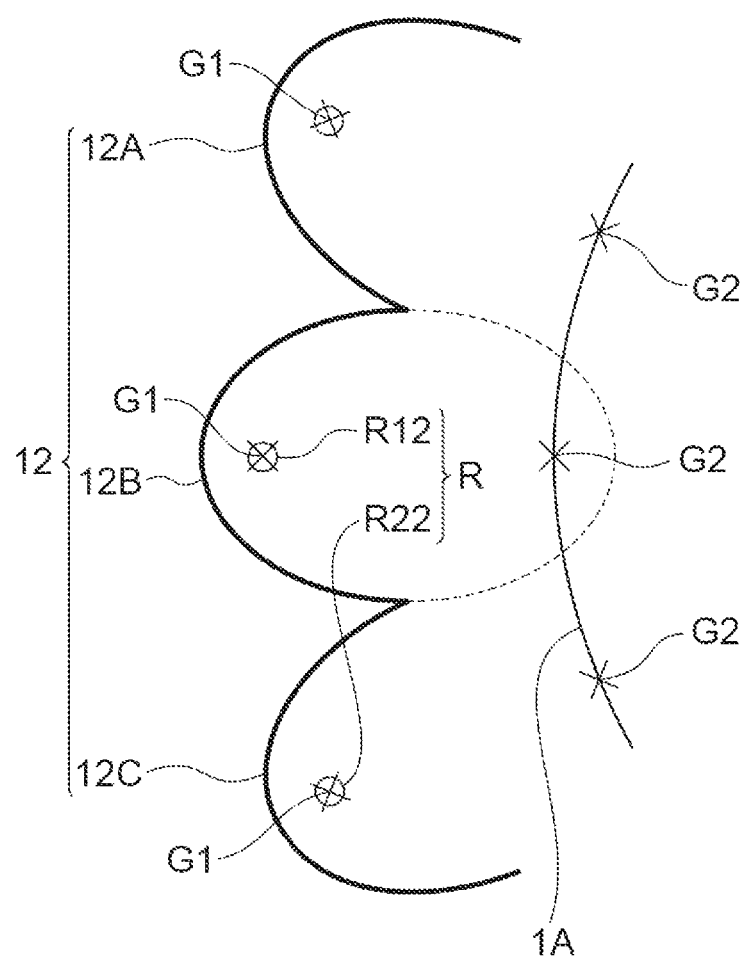
FIG. 7 is a diagram for describing the positional relationship between the electric resistance heater and the reflector.

FIG. 7 is a diagram for explaining the positional relationship between the electric resistance heater R and the reflector 12.

In FIG. 6 described above, the example in which one electric resistance heater is disposed in one concave surface has been described. In FIG. 7, one first resistor R12 of one electric resistance heater R is disposed on the first focal point G1 inside the second concave surface 12B, and the other second resistor R22 is disposed on the first focal point G1 inside the third concave surface 12C. The other configurations in FIG. 7 are the same as those in FIG. 6. Each of the concave surfaces (the first concave surface 12A, the second concave surface 12B, and the third concave surface 12C) shown in FIG. 7 has a cross-sectional shape perpendicular to the longitudinal direction of the first resistor R12 (the resistor central axis RX (refer to FIG. 5)) disposed inside each of the concave surfaces and may have a horizontal cross-sectional shape.

The radiant heat radiated from the resistors (the first resistor R12 and the second resistor R22) disposed at the first focal point G1 is reflected by the corresponding concave surfaces (the second concave surface 12B and the third concave surface 12C) and reaches the corresponding second focal point G2 on the side surface of the tip portion 1A. Since the radiant heat is focused on and reaches the vicinity of the position of the second focal point G2, the side surface of the tip portion 1A can be melted at a high temperature. The melting point can be changed by rotating the feedstock disposed at the upper portion and/or the crystal disposed at the lower portion with the rotating motor, and uniformity of distribution of the molten material in the circumferential direction can be improved.

Figure 8:
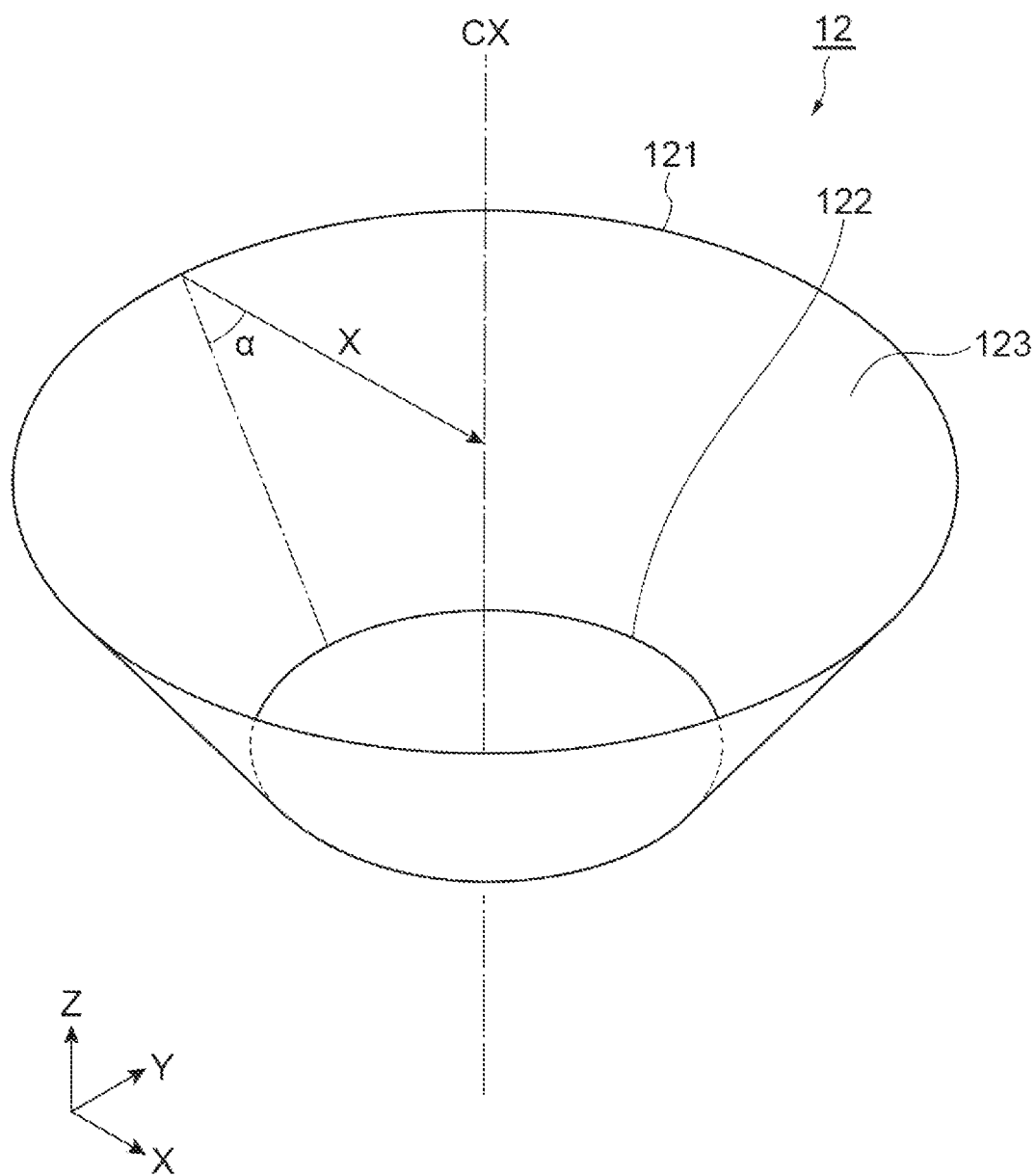
FIG. 8 is a perspective view of a reflector having a different shape.

FIG. 8 is a perspective view of the reflector 12 having a different shape.

The reflector 12 is simpler than the shape of the reflector 12 described above and has a side shape of an inverted truncated cone. The angle (the acute angle α) formed by the reflector inner surface 123 with the horizontal plane is in the range of 30 to 60 degrees. The acute angle α may be in the range of 40 to 50 degrees. An example of a preferable acute angle α is α=45 degrees. That is, the inclination angle (the acute angle α) of the reflector inner surface 123 may be set to be the same as the inclination angle (the acute angle α) of the resistor shown in FIG. 5.

The inclination angle (the acute angle α) of the reflector inner surface 123 is an angle formed by a line segment connecting one point in an inner edge on the reflector upper end surface 121 and one point in an inner edge of the reflector lower end surface 122 with an axis (for example, the X-axis) of the reflector 12 in the radial direction in the plane (for example, the XZ plane) including the central axis CX of the reflector 12.

The radiant heat radiated from the electric resistance heater is reflected by the inner surface of the reflector 12 and reaches the side surface of the tip portion of the feedstock. Since the structure shown in FIG. 8 does not have a radiant heat focusing function as compared with the structure of FIG. 7, heating with relatively high in-plane uniformity is possible. Also in the case of the structure of this example, the feedstock at the upper portion and/or the crystal at the lower portion may be rotated by the rotating motor.

Figure 9:
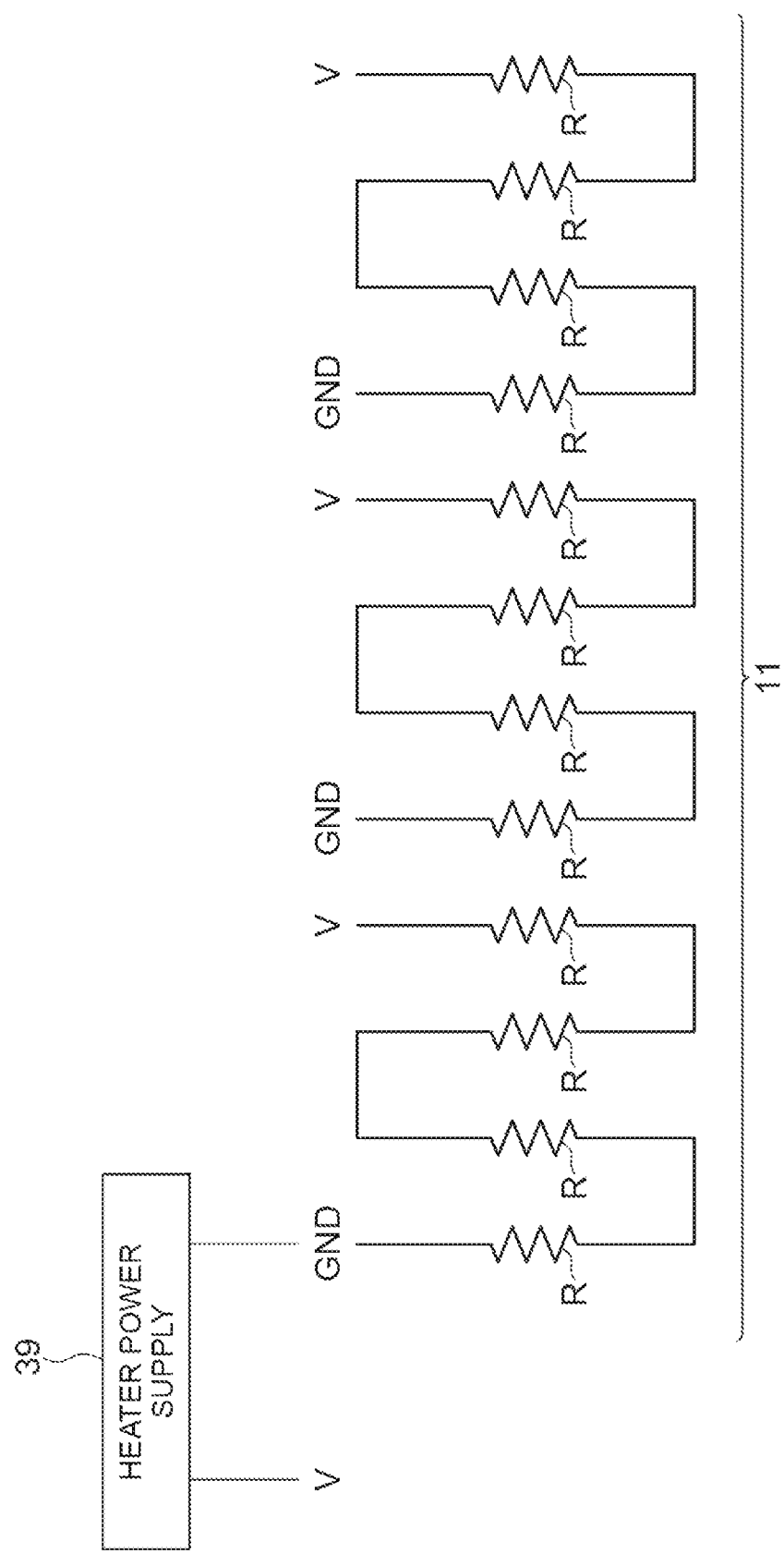
FIG. 9 is a circuit diagram showing an example of an electrical connection of the electric resistance heater.

FIG. 9 is a circuit diagram showing an example of the electrical connection of the electric resistance heater.

The individual electric resistance heaters R constituting the electric resistance heater group 11 are resistors. Electric power is supplied to the plurality of electric resistance heaters R from the heater power supply 39. Various forms can be considered for a connection method of the plurality of electric resistance heaters R. In the drawing, N electric resistance heaters R (example: N=4) are set as one resistance unit, and three resistance units are shown. In one resistance unit, electric resistance heaters R are connected in series, one end of the resistance unit is connected to the ground potential GND, and the other end is connected to the power supply potential V. Each of the resistance units (one or the plurality of electric resistance heaters) is connected in parallel to the heater power supply. All the electric resistance heaters R may be connected in series. One end of each of the electric resistance heaters R may be connected to the ground potential GND, and the other end may be connected to the power supply potential V.

Since the heater power supply 39 outputs a DC voltage or an AC voltage, the power supply potential V is a DC potential or an AC potential. When a direct current is supplied to the electric resistance heater R, a resistance value of the electric resistance heater R depends on a cross-sectional area in which the current flows, and a large amount of heat is generated in a portion of the resistor having a small diameter. When an alternating current is supplied to the electric resistance heater R, the alternating current tends to flow through the vicinity of the surface, but a large amount of heat is generated in the portion of the resistor having a small diameter. Of course, a shape of the resistor is not limited to the above-described form, and various shapes such as a simple rod-shaped resistor can be used.

Figure 10:
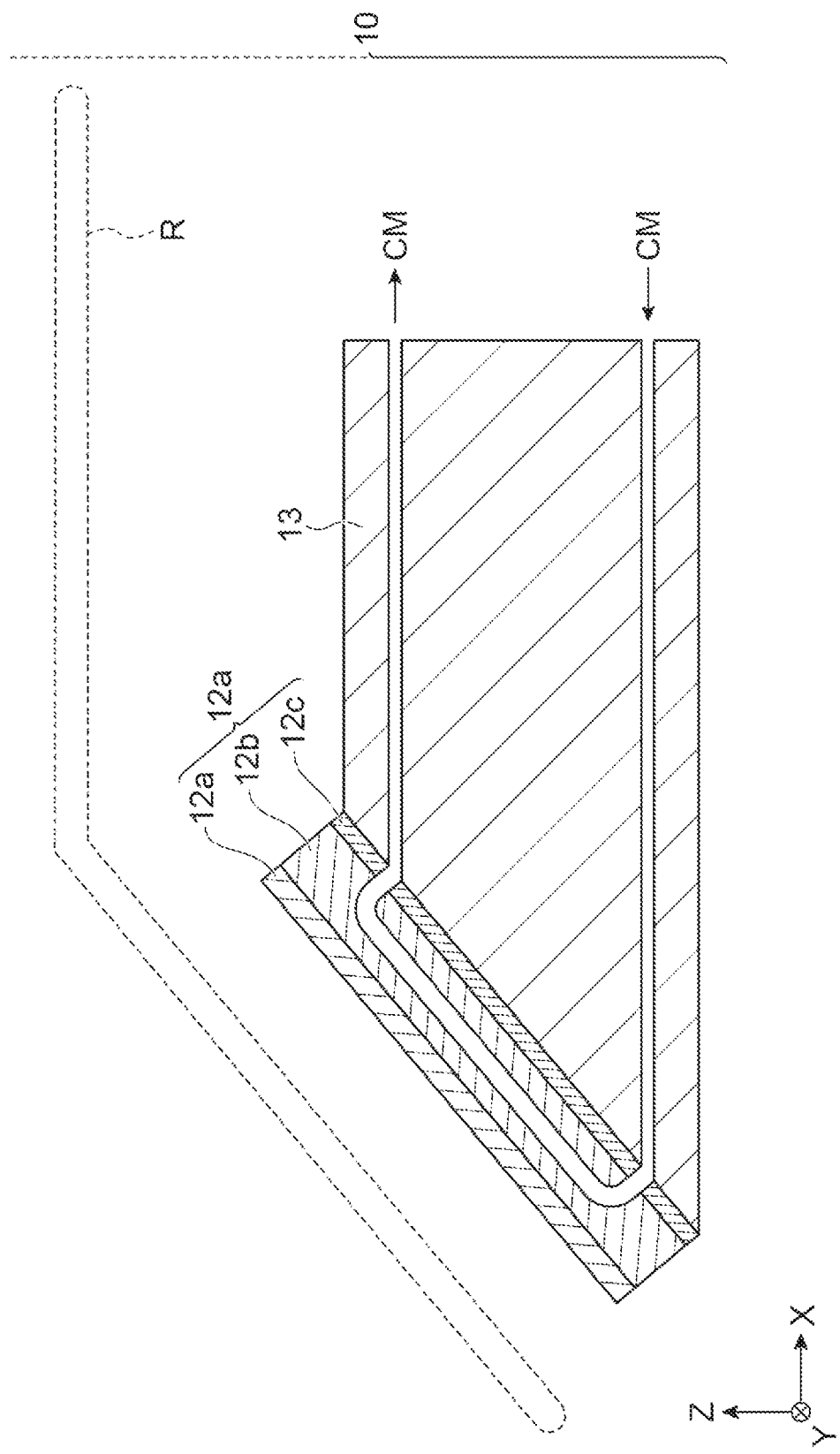
FIG. 10 is a diagram showing a longitudinal cross-sectional structure of a heating device having a cooling structure.

FIG. 10 is a diagram showing a longitudinal cross-sectional structure of the heating device 10 having a cooling structure.

The reflector 12 included in the heating device 10 is made of a material having high heat resistance and high reflectance. The reflector 12 can be made entirely of platinum (Pt), for example. As shown in FIG. 10, the reflector 12 may be configured of a multilayer film, and the reflector 12 includes a surface layer 12a, a main body layer 12b, and an adhesive layer 12c. The surface layer 12a is made of a material having high reflectance. The main body layer 12b is made of a material having a higher melting point and lower reflectance than that of the surface layer 12a. The adhesive layer 12c is made of, for example, a material containing the material contained in the main body layer 12b. The heat shield 13 is made of an insulator that does not easily transmit radiant heat. The heat shield 13 can be made of a material having a lower conductivity, a lower thermal conductivity, and a higher infrared absorption rate than that of the reflector 12.

For example, the surface layer 12a is made of gold (Au), the main body layer 12b is made of platinum (Pt), the adhesive layer 12c is made of a mixed layer of platinum and aluminum oxide (alumina: $Al_2O_3$), and the heat shield 13 is made of single crystal alumina. In the drawing, a flow path for a cooling medium is formed inside the main body layer 12b, and a cooling medium CM is supplied. There are various materials for the cooling medium CM, for example, water. Cooling media such as heavy water, carbon dioxide, helium, metallic sodium, a sodium-potassium alloy, mercury and air are also known. The heat shield 13 may have a flow path for the cooling medium CM, and this flow path may be communicated with the flow path of the main body layer 12b.

From the viewpoint of heat resistance, suppression of cracking due to thermal stress, and the like, the heat shield 13 may be made of a porous ceramic (an insulator). For example, the heat shield 13 can be made of porous alumina. In this case, the cooling medium supplied to the main body layer 12b is supplied to the main body layer 12b using a flow path (a pipe or the like) made of a material different from that of the heat shield 13. A material of an inner surface of the flow path is made of a metal such as platinum (Pt) or copper (Cu), and may be provided inside the heat shield 13 or may be provided outside the heat shield 13.

When $\beta$-$Ga_2O_3$ or the like is grown, the material constituting the heat shield 13 is preferably a stable material in an environment of 1800° C. and an oxygen partial pressure of 10% or more, similar to the electric resistance heater (the heating element). For example, the material of the heat shield 13 can include at least one type of ceramic selected from a group consisting of aluminum oxide, magnesium oxide, and zirconium oxide. In particular, zirconium oxide (zirconia) is preferable as a material for the heat shield 13 because of a low thermal conductivity thereof. These materials may be porous. The structure of the heat shield 13 does not have to be formed of a single insulator block and may be configured by combining a plurality of blocks.

Figure 11:
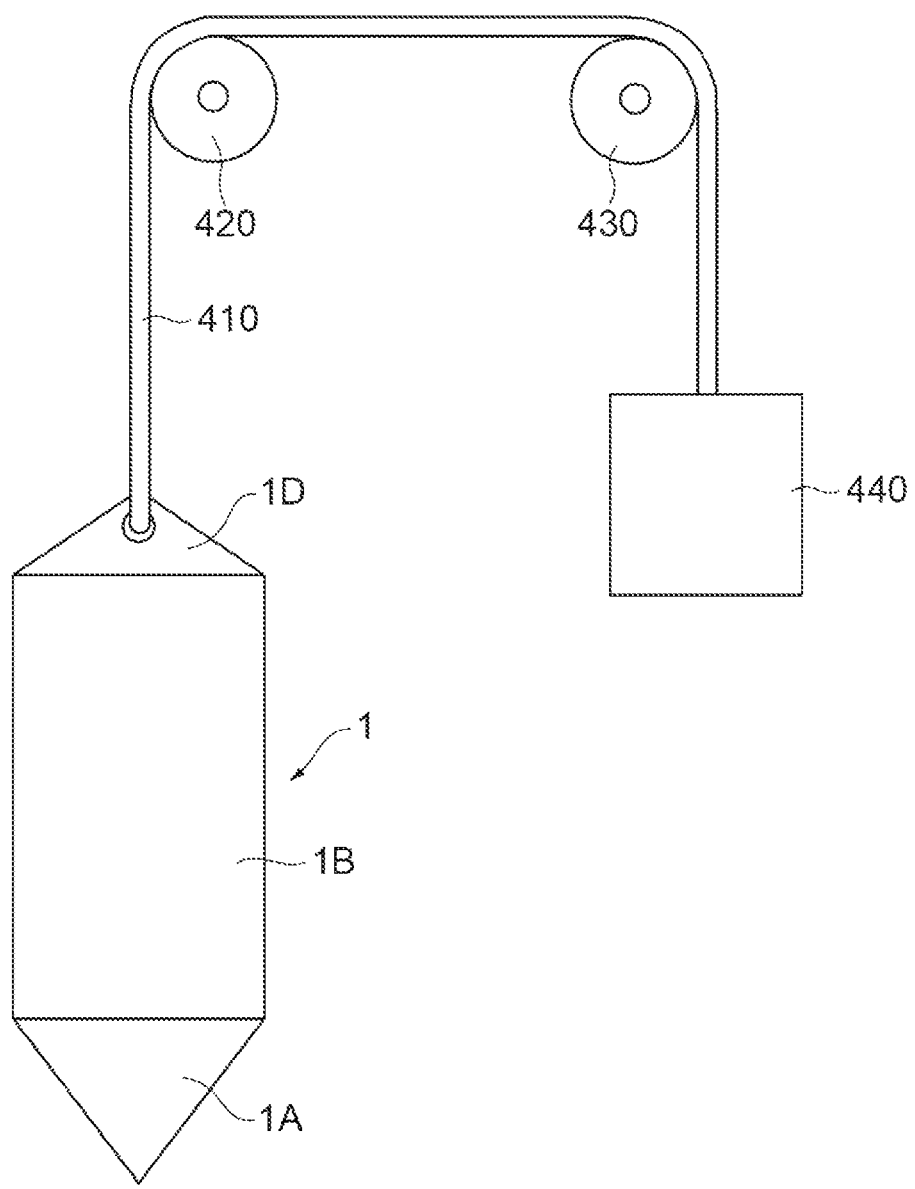
FIG. 11 is a diagram showing a structural example of a support that suspends a feedstock.

FIG. 11 is a diagram showing a structural example of a support that supports the feedstock by suspending it with a wire.

Although FIG. 1 shows the structure of the support of the type in which the feedstock 1 is supported by an upper shaft, the support may be a support wire 410. The upper end portion of the feedstock 1 has a second engaging portion 1D having a through hole through which the support wire 410 passes. The support wire 410 is engaged in the through hole and is connected to a weight 440 via a first pulley 420 and a second pulley 430. A position of the weight 440 can also be moved using a device such as the first drive mechanism shown in FIG. 1.

Figure 12:
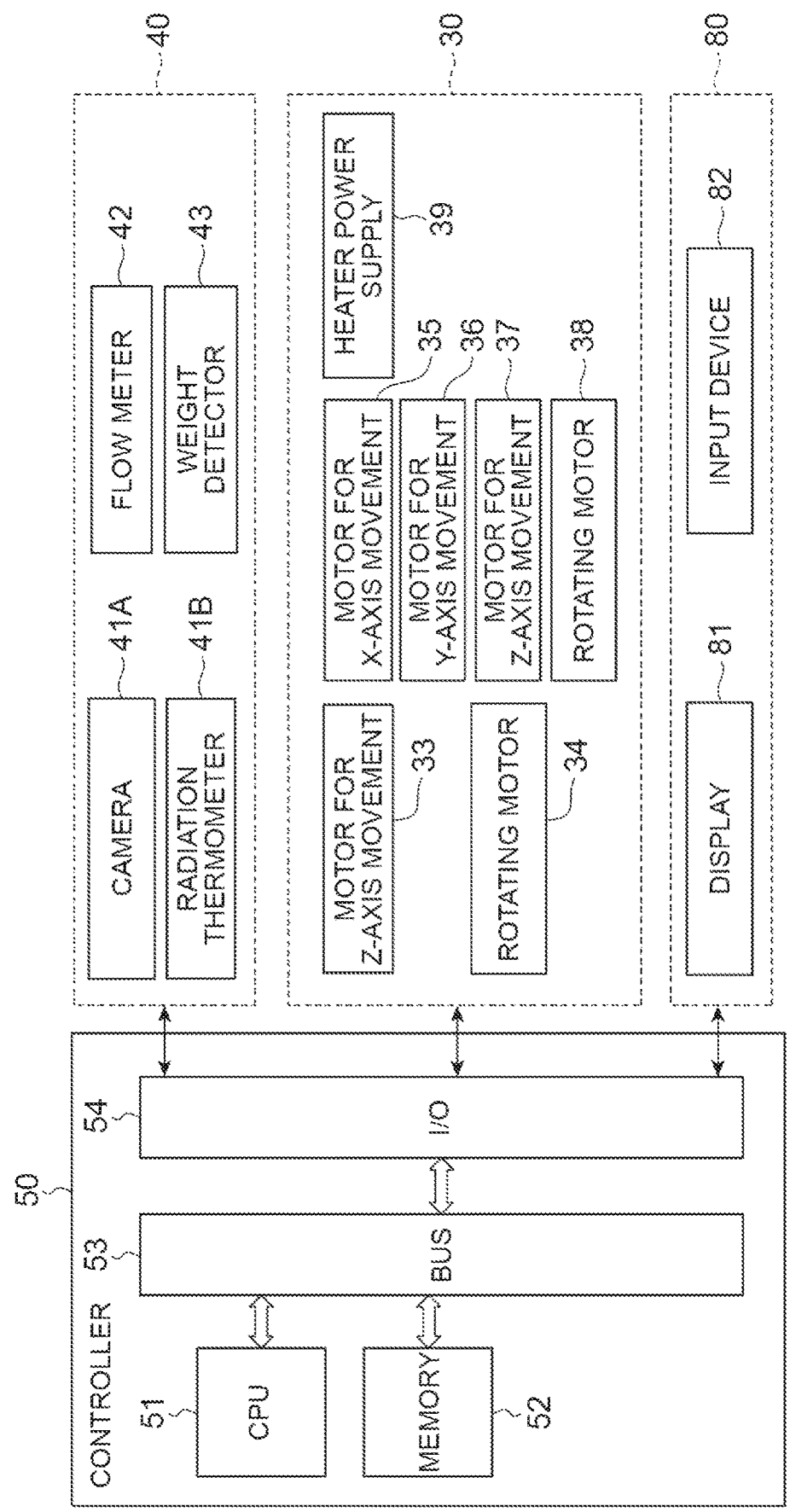
FIG. 12 is a block diagram of a control system.

FIG. 12 is a block diagram of a control system.

The controller 50 includes a central processing unit 51, a memory 52, a bus 53, and an input and output interface 54. The controller 50 controls a control target group 30 according to a program stored in the memory 52. A plurality of detection signals from a sensor group 40 is input to the controller 50, and a device of the control target group 30 can be controlled so that detection values of the plurality of detection signals become target values. The input and output device 80 includes a display 81 and an input device 82 such as a keyboard and a mouse and constitutes an interface with a human being.

The control target group 30 includes the upper motor 33 for the Z-axis movement, the upper rotating motor 34, and the lower motor 35 for the X-axis movement, the lower motor 36 for the Y-axis movement, the lower motor 37 for the Z-axis movement, the lower rotating motor 38, and the heater power supply 39 shown in FIG. 1.

The sensor group 40 includes a weight detector 43 in addition to a camera 41A as the detection element 41 shown in FIG. 1, a radiation thermometer 41B, and the flow meter 42. The weight detector 43 is a weight scale (a load cell) that measures a weight of the first drive mechanism 31 and/or the second drive mechanism 32 shown in FIG. 1. The weight detector 43 can measure a reduced weight of the feedstock and an increased weight of the crystal during the crystal growth period. The weight scale may measure the total weight of each of the drive mechanisms and may also be configured to measure a part of the weight.

Next, an example in which a $\beta$-$Ga_2O_3$ single crystal is manufactured using the above-described crystal manufacturing apparatus will be described.

First, the feedstock 1 disposed inside the processing container 71 shown in FIG. 1 and the seed crystal 2B are prepared.

Since the feedstock 1 is a material that is a source of growing a single crystal, preferably, the feedstock 1 has a high purity. Specifically, gallium oxide having a purity of 4N can be used as the feedstock 1. The feedstock 1 may contain a dopant (for example, tin (Sn)) that functions in the crystal after manufacturing. The feedstock 1 can be manufactured, for example, as follows. A shrinkable rubber container is filled with gallium oxide powder, shaping is performed, and then a mouth of the container is closed. Next, pressure is applied to the container to compress and solidify the gallium oxide powder, and the solidified feedstock 1 is manufactured. As a pressure application method at this time, cold isostatic pressing (CIP) can be used. The compressed and solidified shaped body of the gallium oxide powder may be further heated to be sintered, and the density of the feedstock 1 may be increased. In addition, instead of the above-described CIP, hot isostatic heating (HIP) may be performed.

When the feedstock 1 containing the dopant is manufactured, the dopant and the gallium oxide powder are sufficiently stirred and uniformly mixed. The feedstock 1 can be manufactured by subjecting the mixed powder raw material to the above-described solidification and heating treatment. It is preferable not to add a sintering aid or the like to the powder raw material.

Due to the pressure application step described above, the shape of the feedstock 1 becomes a shape having a tapered tip portion 1A. The shape of the tip portion 1A is generally a cone shape (an inverted cone). The feedstock 1 has strength and uniformity which does not crack due to a change in the temperature in a crystal manufacturing process and in which the amount of the molten material does not change discontinuously regardless of a crystal state such as a particle size and orientation.

The seed crystal 2B is a material that serves as a starting point for crystal growth. An orientation of the growing crystal is determined by an orientation of the seed crystal 2B. A $\beta$-$Ga_2O_3$ single crystal is used as the seed crystal 2B. For example, a part of the crystal manufactured last time is used as the seed crystal 2B. As the seed crystal 2B, a $\beta$-$Ga_2O_3$ single crystal manufactured by a molecular beam epitaxy (MBE) method or the like may be used.

Next, the seed crystal 2B is fixed to the seed crystal holder 7. Further, the feedstock 1 having the tapered tip portion 1A is disposed above a surface (a crystal growth region) of the seed crystal 2B. The weight detector 43 shown in FIG. 12 detects a weight of the feedstock 1 and a weight of the crystal 2 including the seed crystal 2B, and a detection signal is input to the controller 50. The central processing unit 51 displays the weight of the feedstock 1 and the weight of the crystal 2 on the display 81 according to the program stored in the memory 52. The upper motor 33 for the Z-axis movement and the lower motor 37 for the Z-axis movement are driven to adjust a distance between the feedstock 1 and the seed crystal 2B to a desired value. Oxygen ($O_2$) and argon (Ar) gas are supplied from the gas source 61 into the processing container 71 via the flow meter 42. An oxygen partial pressure is set to 10% or more. The pump 62 is started to exhaust the gas inside the processing container 71. If necessary, the gas in the processing container 71 may be replaced with another gas before oxygen is supplied into the processing container 71. When the preparation for starting crystal growth is completed, the central processing unit 51 starts the crystal manufacturing process according to the program stored in the memory 52. The following operations are performed by the central processing unit 51 generating a control signal based on the program and controlling the elements to be controlled based on the control signal.

First, the controller 50 supplies electric power to the heater power supply 39 to generate heat of the electric resistance heater R. The camera 41A (for example, a CCD camera) acquires an image of the tip portion 1A, and the controller 50 displays the image on the display 81. The radiation thermometer 41B measures a temperature of the tip portion 1A and inputs the measured detection signal to the controller 50. The controller 50 feedback-controls the power supplied to the heater power supply 39 so that the target temperature (about 1800° C.) is obtained. A temperature rise time from room temperature to the target temperature is several hours.

During the temperature rise, it is preferable to keep the feedstock 1 and the seed crystal 2B at a position away from a heating region. In this case, the radiation thermometer 41B measures a temperature of the electric resistance heater R instead of the tip portion 1A, drives the upper motor 33 for the Z-axis movement after the temperature of the electric resistance heater R reaches the target temperature and a temperature stabilization period elapses, and adjusts the distance between the feedstock 1 and the seed crystal 2B (the distance between the electric resistance heaters R) to a first distance for manufacturing crystal. The controller 50 drives the upper rotating motor 34 to rotate the feedstock 1.

When the side surface of the tip portion 1A begins to melt, the molten material 3 generated on the surface of the cone of the tip portion 1A gathers at the lower end portion, and an image forming a droplet is acquired by the camera 41A and is displayed on the display 81. The controller 50 adjusts the electric power supplied to the heater power supply 39 so that a size of the droplet of the molten material at the lower end portion thereof becomes a predetermined size. This adjustment may be performed by a human being, but an image signal from the camera 41A may be image-processed and the adjustment may be performed automatically. After this state is held for a predetermined time and stabilization of the temperature is awaited, the lower motor 37 for the Z-axis movement is driven to raise the seed crystal 2B, and the distance between the feedstock 1 and the seed crystal 2B is adjusted to a second distance for manufacturing crystal. Thus, the molten material 3 located at the lower end of the tip portion 1A comes into contact with the upper surface of the seed crystal 2B. When the molten material 3 reaches the surface of the seed crystal 2B, the weight of the feedstock 1 and the weight of the seed crystal 2B displayed on the display 81 change, and thus the contact can be confirmed not only from the camera image but also from the output of the weight detector 43.

The controller 50 may control the temperature of the crystal 2 by controlling the heating element 74 shown in FIG. 1. For example, the heating element 74 can preheat the seed crystal 2B before crystal growth. Thus, an abrupt temperature change can be suppressed, and thus thermal stress applied to the seed crystal can be suppressed.

After the molten material 3 (a liquid column) is formed between a lower end of the tip portion 1A and an upper end of the seed crystal 2B, a period of time during which this state stabilizes is awaited. When the molten material is solidified, the crystal main body portion 2A is formed on the surface of the seed crystal 2B, and an upper surface of the crystal main body portion 2A becomes a new crystal growth region. When crystal growth starts, the upper motor 33 for the Z-axis movement is driven to lower the feedstock 1 by a predetermined distance, and the lower motor 37 for the Z-axis movement is driven to lower the seed crystal 2B by a predetermined distance. This predetermined distance depends on the reduced weight of the feedstock 1 and/or the increased weight of the crystal 2 detected by the weight detector 43. The controller 50 controls so that a distance between the upper surface of the crystal growth region and the tip portion 1A to be heated is constant. In other words, during the crystal growth period, the positions of the seed crystal holder and the feedstock holder are raised and lowered by the first and second drive mechanisms, so that the distance between the upper end of the crystal main body portion 2A growing on the seed crystal 2B and the lower end of the tip portion 1A located above is constant.

The controller 50 may also control so that the distance between the side surface of the tip portion 1A and the electric resistance heater R disposed below is constant. Due to these controls, heating is controlled so that the shape of the tip portion 1A does not change during the crystal growth period. Of course, the controller 50 may finely adjust the electric power supplied from the heater power supply 39. During the crystal growth period, the output from the sensor is constantly monitored, and the above controls are continued.

When the size of the crystal 2 reaches a target value, the amount of the molten material 3 supplied from the feedstock 1 to the crystal growth region is reduced. When the electric power supplied from the heater power supply 39 is reduced or the position of the feedstock 1 is separated from the electric resistance heater R, the amount of the molten material 3 supplied is reduced. Finally, the upper motor 33 for the Z-axis movement is driven to raise the position of the feedstock 1 and to separate the molten material 3 from the crystal growth region. Then, the electric power supplied from the heater power supply 39 and the electric power supplied to the heating element 74 are gradually reduced to cool the feedstock 1 and the crystal 2 to room temperature. During cooling, the upper motor 33 for the Z-axis movement may be driven to greatly raise the position of the feedstock 1, and the lower motor 37 for the Z-axis movement may be driven to greatly lower the position of the crystal 2.

During this cooling, the crystal growth region may be thermally blocked from the heating region (the electric resistance heater R and the side surface of the tip portion 1A). For example, another heat shield plate can be disposed on the crystal growth region to perform heat blocking. The temperature of two spaces separated by another heat shield can be controlled independently. When the heating element 74 shown in FIG. 1 is a cylindrical electric furnace, the position of the crystal 2 may be moved to the vicinity of the center of the electric furnace in the axial direction. Since the grown crystal is cooled in a uniform temperature environment, a thermal strain remaining in the crystal can be reduced. After the crystal 2 is cooled to room temperature, if necessary, the atmosphere in the processing container 71 is returned to the atmosphere, and then the crystal 2 is taken out of the processing container 71, and the crystal manufacturing process is ended.

The manufactured crystal 2 is a $\beta$-$Ga_2O_3$ single crystal, and a diameter $\varphi$ of the upper surface thereof is, for example, 2 inches. It is also possible to manufacture a single crystal having a diameter $\varphi$ of 2 inches or more. According to the above-described crystal manufacturing apparatus, since a crucible is not used, impurities are not mixed from the crucible, oxygen deficiency generated under a low oxygen partial pressure does not occur, and a large gallium oxide single crystal can be grown.

During the crystal growth period, the seed crystal 2B can also be rotated by the lower rotating motor 38. A first rotation direction RD1 and a first rotation speed RS1 of the feedstock 1, and a second rotation direction RD2 and a second rotation speed RS2 of the seed crystal 2B have the following combinations.

In the case of the same direction and synchronous rotation, the first rotation direction RD1 and the second rotation direction RD2 are the same, and the first rotation speed RS1 and the second rotation speed RS2 are the same. In this case, since there is no difference in the rotation speeds of them, there is no twisting force applied to the molten material, and defect formation due to such an applied force is suppressed.

In the case of the same direction and asynchronous rotation, the first rotation direction RD1 and the second rotation direction RD2 are the same, and the first rotation speed RS1 and the second rotation speed RS2 are different. In this case, since there is a slight difference in the rotation speeds therebetween, homogenization of the molten material in the circumferential direction is somewhat promoted.

In the case of reverse rotation, the first rotation direction RD1 and the second rotation direction RD2 are opposite to each other, and the first rotation speed RS1 and the second rotation speed RS2 are inevitably different. In this case, since a large twisting force acts on the molten material, homogenization of the molten material in the circumferential direction is promoted.

During the crystal growth period, the seed crystal 2B may be horizontally moved by the lower motor 35 for the X-axis movement and the lower motor 36 for the Y-axis movement. These motors drive the second drive mechanism 32 including a horizontal movement mechanism such as an XY stage. Thus, the position of the molten material 3 supplied from the feedstock 1 in the horizontal plane can be adjusted. A crystal having a large area can be manufactured by moving the seed crystal 2B significantly in the horizontal plane. For example, the seed crystal 2B can be moved to draw a spiral or to scan in the horizontal plane.

As described above, the crystal manufacturing method according to the embodiment includes a step of disposing a raw material (a feedstock) having the tapered tip portion 1A above the crystal growth region 2U, and a step of selectively heating and melting the side surface of the tip portion 1A by radiant heat traveling diagonally upward while the shape of the tip portion 1A is maintained and physically connecting the side surface of the tip portion 1A to the upper surface of the crystal growth region 2U due to the material (the molten material 3) melted from this side surface. In the conventional FZ method using an RF heater, not only heat is generated in the material, but also a binding force is applied to the molten material by an electromagnetic field. On the other hand, unlike the conventional method, in this crystal manufacturing method, when the side surface of the tip portion 1A is selectively irradiated with radiant heat to melt the material, such a binding force is suppressed, and a size of the manufactured single crystal can be increased.

In the vertical cross section (the XZ plane) including the central axis CX of the feedstock 1, the acute angle θ formed by the side surface of the tip portion 1A and the horizontal plane located above the side surface is preferably in the range of 30 to 60 degrees. The acute angle θ is more preferably in the range of 40 to 50 degrees. When the acute angle θ is in such a range, particularly when a single crystal of a compound semiconductor such as gallium oxide is manufactured, the molten material 3 can be stably supplied onto the crystal growth region 2U.

In the above-described embodiment, the radiant heat traveling diagonally upward is radiated from the electric resistance heater R disposed between the tip portion 1A and the crystal growth region 2U. The side surface of the tip portion 1A is also a lower surface of the feedstock 1 and can efficiently receive the radiant heat traveling diagonally upward. The radiant heat traveling diagonally upward can include the radiant heat radiated downward from the electric resistance heater R and reflected by the (heat) reflector 12. The reflector 12 can increase an amount of radiant heat applied to the side surface of the tip portion 1A. When the electric resistance heater R is used, the binding force of the molten material 3 due to the electromagnetic field is weak, and a space sufficient for disposing the electric resistance heater R can be formed below the molten material 3.

In the above-described embodiment, the inner surface of the reflector 12 preferably includes a ring shape including concave surfaces that are continuous in the circumferential direction of the reflector 12. The concave surfaces can focus radiant heat on the side surface of the tip portion 1A and can heat the side surface at a high temperature. A focusing position of the radiant heat due to a concave mirror configured of the concave surface does not necessarily have to coincide on the side surface. As the shape of the concave surface, it is preferable to form an ellipsoidal mirror in a horizontal plane or a plane perpendicular to the resistor central axis RX, but other shapes such as a parabolic mirror are also possible.

In the above-described embodiment, the reflector 12 has a reflector opening S12, and information of the feedstock 1 is detected through the reflector opening S12. A shape of the reflector opening S12 may be a slit or a slot as well as a simple circular through hole.

In the above-described embodiment, the radiant heat radiated downward from the electric resistance heater R is blocked by the heat shield disposed between the electric resistance heater R and the crystal growth region 2U. In this case, the crystal growth region 2U can be set to a solidification temperature lower than the melting point of the material, and the temperature can be easily controlled independently of the electric resistance heater R.

In the above-described embodiment, the crystal growth region may be moved horizontally during the crystal growth period. In this case, a crystal having a large area can be grown.

In the above-described embodiment, during the crystal growth period, due to radiant heat, the side surface of the tip portion 1A has a periodic temperature distribution in the circumferential direction, and the tip portion 1A is rotated around the central axis of the tip portion 1A. This rotation increases the heating uniformity of the tip portion 1A.

In the above-described embodiment, the crystal manufacturing apparatus 100 includes a means for performing the above-described steps. That is, the crystal manufacturing apparatus 100 includes a means (for example, the support including the feed holder 4, the connection block 5, the upper shaft 6, and the first drive mechanism 31) for disposing the feedstock 1 having the tapered tip portion 1A above the crystal growth region 2U, and a means (the electric resistance heater R) for selectively heating and melting the side surface of the tip portion 1A by radiant heat traveling diagonally upward while the shape of the tip portion 1A is maintained and physically connecting the side surface of the tip portion 1A to the upper surface of the crystal growth region 2U due to the material melted from the side surface.

The crystal manufacturing apparatus 100 includes the support (for example, the support including the feed holder 4, the connection block 5, the upper shaft 6, and the first drive mechanism 31) that supports the feedstock having the tapered tip portion 1A, the electric resistance heater R that generates radiant heat for melting the feedstock that travels diagonally upward, and the heat shield disposed below the electric resistance heater R. The radiant heat radiated downward from the electric resistance heater R is shielded by the heat shield. The radiant heat traveling diagonally upward from the electric resistance heater R can selectively reach the side surface of the tapered tip portion 1A. When the material on the side surface melts, the melted material moves downward along the side surface and reaches the crystal growth region located below the side surface. When a crystal is manufactured using the crystal manufacturing apparatus 100, a size thereof can be increased.

The crystal manufacturing apparatus 100 includes the first drive mechanism 31 that raises and lowers the support at least, the upper motor 33 (a motor) for the Z-axis movement that operates the first drive mechanism 31, the detection element 41 that acquires information on the tip portion 1A of the feedstock 1, and the controller 50 connected to an output terminal of the detection element 41 and controls the upper motor 33 for the Z-axis movement (and the lower motor 37 for the Z-axis movement). The detection element 41 can acquire information (the temperature and the image) of the tip portion 1A. The controller 50 can perform feedback control so that the detected temperature of the tip portion 1A coincides with a target temperature and the inclination angle of the side surface of the molten material obtained from the image coincides with a target inclination angle. The control targets include the distance between the electric resistance heater R and the tip portion 1A, the rotation speed of the feedstock 1, and the like, in addition to the electric power supplied from the heater power supply 39. For example, when the inclination angle of the side surface of the molten material 3 becomes large, it is determined that the temperature of the lower portion of the tip portion 1A is higher than that of the upper portion, and the feedstock 1 is lowered. For example, when the inclination angle of the side surface of the molten material 3 differs according to the rotation angle, the rotation speed is increased.

The above-described single crystal is a single crystal formed on the crystal growth region 2U by disposing the feedstock 1 having the tapered tip portion 1A above the crystal growth region 2U, selectively heating and melting the side surface of the tip portion 1A by radiant heat traveling diagonally upward while the shape of the tip portion 1A is maintained, and physically connecting the side surface of the tip portion 1A to the upper surface of the crystal growth region 2U due to the material melted from this side surface. The size of this crystal can be increased. In particular, when the feedstock 1 is a solid containing gallium and oxygen and the single crystal to be manufactured is gallium oxide, the above-described manufacturing method and manufacturing apparatus are useful.

The present invention is not limited to the above-described embodiment, and various modifications are possible. For example, as the electric resistance heater R, an electric resistance heater having a shape other than the U-shape may be used. In the above-described embodiment, electric resistance heaters R are disposed to surround the tip portion 1A, and a periodic temperature distribution in the circumferential direction in the horizontal plane is formed on the side surface of the tip portion 1A. When the traveling direction of the radiant heat is diagonally upward, a configuration in which a periodic temperature distribution is not formed may be used. For example, an electric resistance heater having a shape forming a ring in a horizontal plane may be used.

The reflector 12 may be fixed to the heat shield 13 via a spacer or may be brought into close contact with the heat shield 13. An outer surface of the reflector 12 may be stepped as long as the reflector 12 has a shape that fits into the heat shield 13. In the above, in the cross section perpendicular to the longitudinal direction of the first resistor R12 of the electric resistance heater R, the reflector inner surface has an elliptical shape, and the resistor is disposed in the vicinity of the focal position thereof, but in the horizontal cross section, the reflector inner surface has an elliptical shape, and the resistor may be disposed in the vicinity of the focal position thereof.

The above-described crystal manufacturing apparatus includes a region having a function of supplying the feedstock 1, a region having a function of heating the feedstock 1 such as a heater, and a region in which the crystal 2 is grown. The arrangement of each of the regions can be variously modified as long as a function of crystal growth is achieved. In order to manufacture a large single crystal, to improve the quality of single crystal, to improve production efficiency, or the like, if necessary, the elements disclosed in the above embodiments may be omitted, replaced and/or modified.

What is claimed is:

1. A crystal manufacturing method comprising:
   disposing a feedstock including a tapered tip portion above a crystal growth region; and
   selectively heating and melting a side surface of the tip portion by radiant heat traveling diagonally upward while a shape of the tip portion is maintained, and physically connecting the side surface of the tip portion to an upper surface of the crystal growth region by a material melted from the side surface.

2. The crystal manufacturing method according to claim 1,
   wherein, in a vertical cross section including a central axis of the feedstock, an acute angle formed by the side surface of the tip portion and a horizontal plane located above the side surface is in a range of 30 to 60 degrees.

3. The crystal manufacturing method according to claim 1,
   wherein, in a vertical cross section including a central axis of the feedstock, an acute angle formed by the side surface of the tip portion and a horizontal plane located above the side surface is in a range of 40 degrees to 50 degrees.

4. The crystal manufacturing method according to claim 1,
   wherein the radiant heat traveling diagonally upward is radiated from an electric resistance heater disposed between the tip portion and the crystal growth region.

5. The crystal manufacturing method according to claim 4,
   wherein the radiant heat traveling diagonally upward includes radiant heat radiated downward from the electric resistance heater and reflected by a reflector.

6. The crystal manufacturing method according to claim 5,
   wherein an inner surface of the reflector includes a ring shape including concave surfaces that are continuous in a circumferential direction of the reflector.

7. The crystal manufacturing method according to claim 5,
wherein the reflector has a reflector opening, and information on the feedstock is detected through the reflector opening.

8. The crystal manufacturing method according to claim 4,
wherein the radiant heat radiated downward from the electric resistance heater is blocked by a heat shield disposed between the electric resistance heater and the crystal growth region.

9. The crystal manufacturing method according to claim 1,
wherein, during a crystal growth period, the crystal growth region is moved horizontally.

10. The crystal manufacturing method according to claim 1,
wherein, during a crystal growth period, the side surface of the tip portion has a periodic temperature distribution in a circumferential direction due to the radiant heat, and the tip portion is rotated around a central axis of the tip portion.

11. A crystal manufacturing apparatus comprising:
means for disposing a feedstock including a tapered tip portion above a crystal growth region; and
means for selectively heating and melting a side surface of the tip portion by radiant heat traveling diagonally upward while a shape of the tip portion is maintained, and physically connecting the side surface of the tip portion and an upper surface of the crystal growth region by a material melted from the side surface.

12. A crystal manufacturing apparatus comprising:
a support configured to support a feedstock with a tapered tip portion;
an electric resistance heater (i) below the support in an up-down direction, (ii) configured to generate radiant heat that travels diagonally upward to melt the feedstock supported by the support and (iii) including a resistance portion that is inclined with respect to a horizontal plane and the up-down direction; and
a heat shield below the electric resistance heater.

13. The crystal manufacturing apparatus according to claim 12, further comprising:
a drive mechanism configured to at least raise and lower the support in the up-down direction;
a motor configured to operate the drive mechanism;
a detection element configured to acquire information on the tip portion of the feedstock supported by the support; and
a controller connected to an output terminal of the detection element and configured to control the motor.

14. The crystal manufacturing apparatus according to claim 12,
wherein the heat shield comprises an opening (i) penetrating the heat shield and (ii) including:
a first diameter adjacent the feedstock; and
a second diameter (i) smaller than the first diameter and (ii) adjacent a crystal growth region under the heat shield.

* * * * *